US012684774B2

(12) United States Patent
Kim et al.

(10) Patent No.: US 12,684,774 B2
(45) Date of Patent: Jul. 14, 2026

(54) SEMICONDUCTOR MEMORY DEVICE HAVING BLOCKING PATTERNS

(71) Applicant: SAMSUNG ELECTRONICS CO., LTD., Suwon-si (KR)

(72) Inventors: Sam Ki Kim, Suwon-si (KR); Nam Bin Kim, Suwon-si (KR); Ji Woong Kim, Suwon-si (KR); Tae Hun Kim, Suwon-si (KR); Sae Rom Lee, Suwon-si (KR); Jun Hee Lim, Suwon-si (KR); Nag Yong Choi, Suwon-si (KR); Sun Gyung Hwang, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 420 days.

(21) Appl. No.: 18/232,948

(22) Filed: Aug. 11, 2023

(65) Prior Publication Data

US 2024/0188294 A1    Jun. 6, 2024

(30) Foreign Application Priority Data

Dec. 1, 2022    (KR) ........................ 10-2022-0166027

(51) Int. Cl.
*H10B 43/27*        (2023.01)
*H10B 43/40*        (2023.01)

(52) U.S. Cl.
CPC ............. *H10B 43/27* (2023.02); *H10B 43/40* (2023.02)

(58) Field of Classification Search
CPC ........ H10B 43/10; H10B 41/27; H10B 41/50; H10B 43/50; H10B 41/35; H10B 43/35
See application file for complete search history.

(56) References Cited

U.S. PATENT DOCUMENTS

| | | | |
|---|---|---|---|
| 8,987,907 B2 | 3/2015 | Kang et al. | |
| 10,002,877 B2 | 6/2018 | Park et al. | |
| 10,566,284 B2 | 2/2020 | Kim et al. | |
| 2002/0113317 A1 | 8/2002 | Okushima | |
| 2015/0214242 A1* | 7/2015 | Lee ........................ | H10B 43/35 |
| | | | 257/329 |
| 2017/0125439 A1* | 5/2017 | Choi ....................... | H10B 43/27 |

(Continued)

FOREIGN PATENT DOCUMENTS

| | | | | |
|---|---|---|---|---|
| CN | 111883534 A | * | 11/2020 | ............. H10D 30/68 |
| CN | 112802846 A | * | 5/2021 | ............. H10D 30/69 |

*Primary Examiner* — William B Partridge
*Assistant Examiner* — Felix B Andrews
(74) *Attorney, Agent, or Firm* — Muir Patent Law, PLLC

(57)        ABSTRACT

A semiconductor memory device comprising a substrate including a cell array area and an extension area, a mold structure including, a plurality of gate electrodes sequentially stacked on the cell array area of the substrate and stacked in a stair shape on the extension area of the substrate, and a plurality of mold insulating films stacked alternately with the plurality of gate electrodes, a plurality of channel structures on the cell array area of the substrate, wherein each of the plurality of channel structures extends through the mold structure and intersects the plurality of gate electrodes, a plurality of cell contacts on the extension area of the substrate and respectively connected to the plurality of gate electrodes, a first interlayer insulating film on the mold structure so as to cover the plurality of channel structures and the plurality of cell contacts.

20 Claims, 36 Drawing Sheets

(56) References Cited

U.S. PATENT DOCUMENTS

| | | | |
|---|---|---|---|
| 2021/0082943 A1 | 3/2021 | Jang | |
| 2021/0210431 A1* | 7/2021 | Kim | H10B 43/50 |
| 2021/0407968 A1 | 12/2021 | Kim et al. | |
| 2022/0084909 A1 | 3/2022 | Kinoshita | |

* cited by examiner

SEMICONDUCTOR MEMORY DEVICE HAVING BLOCKING PATTERNS

CROSS-REFERENCE TO RELATED APPLICATION

Korean Patent Application No. 10-2022-0166027, filed on Dec. 1, 2022, in the Korean Intellectual Property Office, is herein incorporated by reference in its entirety.

BACKGROUND

1. Field

A semiconductor memory device is disclosed.

2. Description of Related Art

In order to meet high performance and low price of a semiconductor memory device as demanded by consumers, it is required to increase integration of the semiconductor memory device.

SUMMARY

Embodiments are directed to a semiconductor memory device including a substrate including a cell array area and an extension area, a mold structure including a plurality of gate electrodes sequentially stacked on the cell array area of the substrate and stacked in a stair shape on the extension area of the substrate, and a plurality of mold insulating films stacked alternately with the plurality of gate electrodes, a plurality of channel structures on the cell array area of the substrate, wherein each of the plurality of channel structures extend through the mold structure and intersect the plurality of gate electrodes, a plurality of cell contacts on the extension area of the substrate and respectively connected to the plurality of gate electrodes, a first interlayer insulating film on the mold structure so as to cover the plurality of channel structures and the plurality of cell contacts, a second interlayer insulating film on the first interlayer insulating film, a plurality of first metal patterns respectively connected to the plurality of channel structures and in the first interlayer insulating film, a plurality of second metal patterns respectively connected to the plurality of cell contacts, a upper surface of each of the plurality of second metal patterns being coplanar with as a upper surface of each of the plurality of first metal patterns, a first blocking pattern entirely covering the upper surfaces of the plurality of first metal patterns, and a plurality of second blocking patterns entirely covering upper surfaces of the plurality of second metal patterns, respectively, at least a portion of the second interlayer insulating film being between adjacent ones of the plurality of second blocking patterns.

Embodiments are directed to a semiconductor memory device including a substrate including a cell array area, an extension area, and a pad area, a mold structure including, a plurality of gate electrodes sequentially stacked on the cell array area of the substrate and stacked in a stair shape on the extension area of the substrate, and a plurality of mold insulating films stacked alternately with the plurality of gate electrodes, a plurality of channel structures on the cell array area of the substrate, wherein each of the plurality of channel structures extends through the mold structure and intersects the plurality of gate electrodes, a plurality of cell contacts on the extension area of the substrate and respectively connected to the plurality of gate electrodes, a plurality of first metal patterns respectively connected to the plurality of channel structures, a first interlayer insulating film on the mold structure so as to cover the plurality of channel structures and the plurality of cell contacts, a plurality of second metal patterns respectively connected to the plurality of cell contacts, a upper surface of each of the plurality of second metal patterns being coplanar with a upper surface of each of the plurality of first metal patterns, and a first blocking layer extending along the upper surfaces of the plurality of first metal patterns and the upper surfaces of the plurality of second metal patterns, the first blocking layer having a plurality of first trenches defined therein exposing at least a portion of the first interlayer insulating film, the first blocking layer overlapping an entirety of each of the upper surfaces of the plurality of first metal patterns, and an entirety of each of the upper surfaces of the plurality of second metal patterns in a thickness direction of the substrate.

Embodiments are directed to a semiconductor memory device including a peripheral circuit structure including a peripheral circuit element, and a cell structure on the peripheral circuit structure, wherein the cell structure includes, a substrate including a cell array area, an extension area, and a pad area, a mold structure including, a plurality of gate electrodes sequentially stacked on the cell array area of the substrate and stacked in a stair shape on the extension area of the substrate, and a plurality of mold insulating films stacked alternately with the plurality of gate electrodes, a first interlayer insulating film covering the mold structure, a plurality of channel structures on the cell array area of the substrate, each of the plurality of channel structures extending through the first interlayer insulating film and the mold structure and intersecting the plurality of gate electrodes, a plurality of cell contacts on the extension area of the substrate, the plurality of cell contacts extending through the first interlayer insulating film and are respectively connected to the plurality of gate electrodes, a through-contact on the pad area of the substrate, the through-contact extending through the first interlayer insulating film and being connected to the peripheral circuit element, a plurality of first metal patterns respectively connected to the plurality of channel structures, a plurality of second metal patterns respectively connected to the plurality of cell contacts, a third metal pattern connected to the through-contact, a first blocking layer extending along upper surfaces of the plurality of first metal patterns, upper surfaces of the plurality of second metal patterns, and a upper surface of the third metal pattern, the first blocking layer having a plurality of first trenches defined therein exposing at least a portion of the first interlayer insulating film, a second interlayer insulating film on the first interlayer insulating film, a plurality of fourth metal patterns in the second interlayer insulating film, and a second blocking layer extending along upper surfaces of the plurality of fourth metal patterns and having a plurality of second trenches defined therein exposing at least a portion of the second interlayer insulating film, the upper surfaces of the plurality of first metal patterns, the upper surfaces of the plurality of second metal patterns, and the upper surface of the third metal pattern being coplanar with each other, the first blocking layer covering an entirety of each of the upper surfaces of the plurality of first metal patterns, an entirety of each of the upper surfaces of the plurality of second metal patterns, and an entirety of the upper surface of the third metal pattern, the second blocking layer covering an entirety of each of the upper surfaces of the plurality of fourth metal patterns, an oxide-based insulating material being in the plurality of first trenches and the plurality of second trenches, the plurality of first trenches being on the extension area of the substrate and the pad area, and being absent on the cell array area of the substrate.

BRIEF DESCRIPTION OF DRAWINGS

Features will become apparent to those of skill in the art by describing in detail exemplary embodiments with reference to the attached drawings in which:

FIG. 19 to FIG. 31 are diagrams sequentially showing a process of manufacturing the semiconductor memory device having the cross section of FIG. 4.

DETAILED DESCRIPTION

Figure 1:
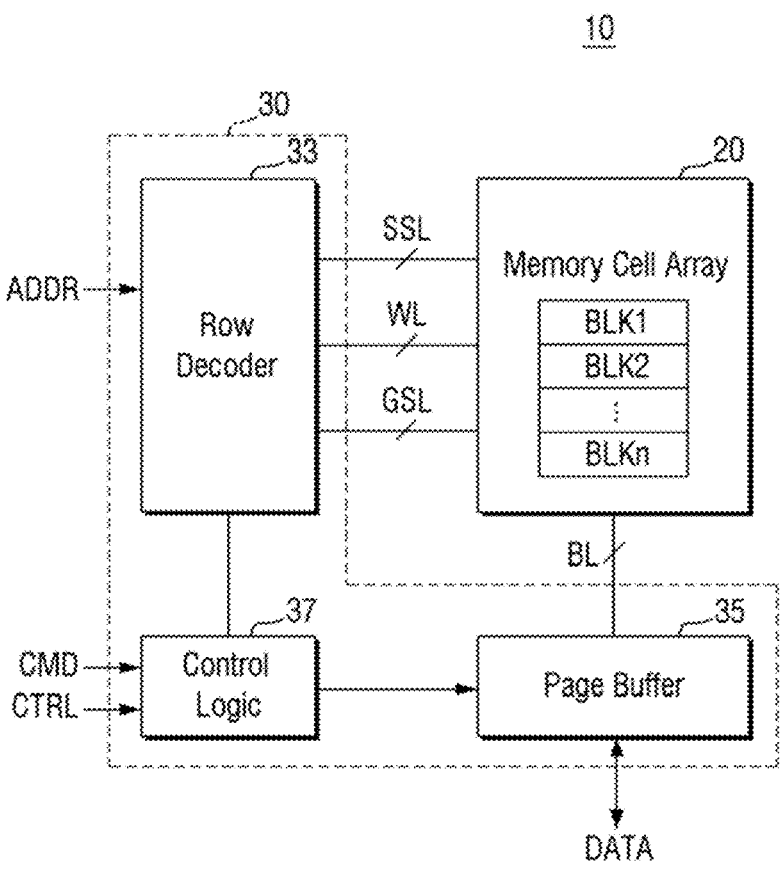
FIG. 1 is an illustrative block diagram of a semiconductor memory device according to example embodiments.

FIG. 1 is an illustrative block diagram of a semiconductor memory device according to example embodiments. Referring to FIG. 1, a semiconductor memory device 10 according to some embodiments may include a memory cell array 20 and a peripheral circuit 30.

The memory cell array 20 may include a plurality of memory cell blocks (BLK1 to BLKn). Each of the memory cell blocks BLK1 to BLKn may include a plurality of memory cells. The memory cell array 20 may be connected to the peripheral circuit 30 via a bit-line BL, a word-line WL, at least one string select line SSL, and at least one ground select line GSL. In an implementation, the memory cell blocks BLK1 to BLKn may be connected to a row decoder 33 via the word-line WL, the string select line SSL, and the ground select line GSL. Further, the memory cell blocks BLK1 to BLKn may be connected to a page buffer 35 via the bit-line BL.

The peripheral circuit 30 may receive an address ADDR, a command CMD, or a control signal CTRL from an external device to the semiconductor memory device 10, and may transmit and receive data DATA to and from an external device to the semiconductor memory device 10. The peripheral circuit 30 may include a control logic 37, the row decoder 33, and the page buffer 35. The peripheral circuit 30 may further include various sub-circuits such as an input/output circuit, a voltage generation circuit for generating various voltages required for an operation of the semiconductor memory device 10, and an error correction circuit for correcting an error of the data DATA read from the memory cell array 20. As used herein, the term "or" is not an exclusive term, e.g., "A or B" would include A, B, or A and B.

The control logic 37 may be connected to the row decoder 33, the input/output circuit, and the voltage generation circuit. The control logic 37 may control overall operations of the semiconductor memory device 10. The control logic 37 may generate various internal control signals used in the semiconductor memory device 10 in response to the control signal CTRL. In an implementation, the control logic 37 may adjust a voltage level of a voltage supplied to the word-line WL and the bit-line BL when performing a memory operation such as a program operation or an erase operation.

The row decoder 33 may select at least one of the plurality of memory cell blocks BLK1 to BLKn in response to the address ADDR, and may select at least one word-line WL, at least one string select line SSL, and at least one ground select line GSL of the selected at least one memory cell block BLK1 to BLKn. Further, the row decoder 33 may transmit a voltage for performing a memory operation to the word-line WL of the selected at least one memory cell block BLK1 to BLKn.

The page buffer 35 may be connected to the memory cell array 20 via the bit-line BL. The page buffer 35 may operate as a writer driver or a sense amplifier. In an implementation, when performing a program operation, the page buffer 35 may operate as the writer driver to apply a voltage based on the data DATA stored in the memory cell array 20 to the bit-line BL. On the other hand, when performing a read operation, the page buffer 35 may operate as the sense amplifier to detect the data DATA stored in the memory cell array 20.

Figure 2:
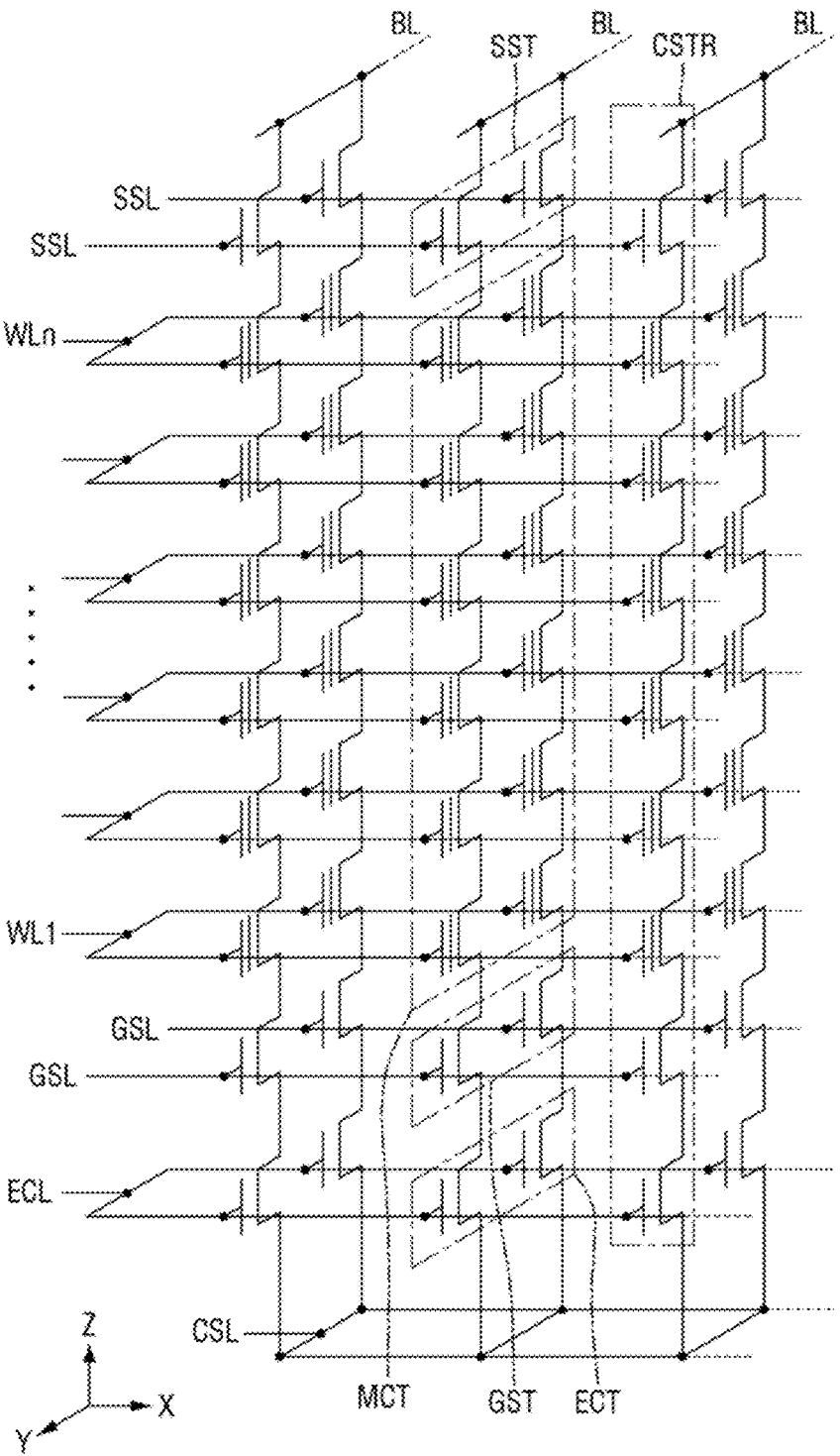
FIG. 2 is an illustrative circuit diagram of a semiconductor memory device according to example embodiments.

FIG. 2 is an illustrative circuit diagram of a semiconductor memory device according to example embodiments. Referring to FIG. 2, a memory cell array (e.g., 20 in FIG. 1) of a semiconductor memory device according to some embodiments may include a common source line CSL, a plurality of bit-lines BL, and a plurality of cell strings CSTR.

The common source line CSL may extend in the first direction X. In some embodiments, a plurality of common source lines CSL may be arranged in a two-dimensional manner. In an implementation, the plurality of common source lines CSL may be spaced apart from each other and extend in the first direction X. The same voltage may be applied to the common source lines CSL. Alternatively, different voltages may be individually applied to the common source lines CSL.

The plurality of bit-lines BL may be arranged in a two-dimensional manner. In an implementation, the bit-lines BL may be spaced apart from each other and extend in the second direction Y intersecting the first direction X. The plurality of cell strings CSTR may be connected in parallel to each of the bit-lines BL. The cell strings CSTR may be connected to the common source line CSL. In an implementation, the plurality of cell strings CSTR may be between the bit-lines BL and the common source line CSL.

Each of the cell strings CSTR may include a ground select transistor GST connected to the common source line CSL, a string select transistor SST connected to the bit-line BL, and a plurality of memory cell transistors MCT between the ground select transistor GST and the string select transistor SST. Each of the memory cell transistors MCT may include a data storage element. The ground select transistor GST, the string select transistor SST and the memory cell transistors MCT may be connected in series to each other in the third direction Z. As used herein, the first direction X, the second direction Y, and the third direction Z may be substantially perpendicular to each other.

The common source line CSL may be commonly connected to sources of the ground select transistors GST. Further, a ground select line GSL, a plurality of word-lines WL1 to WLn and a string select line SSL may be between the common source line CSL and the bit-line BL. The ground select line GSL may act as a gate electrode of the ground select transistor GST. The word-lines WL1 to WLn may be respectively used as gate electrodes of the memory cell transistors MCT. The string select line SSL may act as a gate electrode of the string select transistor SST.

In some embodiments, an erase control transistor ECT may be between the common source line CSL and the ground select transistor GST. The common source line CSL may be commonly connected to sources of the erase control transistors ECT. Further, an erase control line ECL may be between the common source line CSL and the ground select line GSL. The erase control line ECL may act as a gate electrode of the erase control transistor ECT. The erase control transistors ECT may generate gate induced drain leakage (GIDL) to execute an erase operation of the memory cell array.

Figure 3:
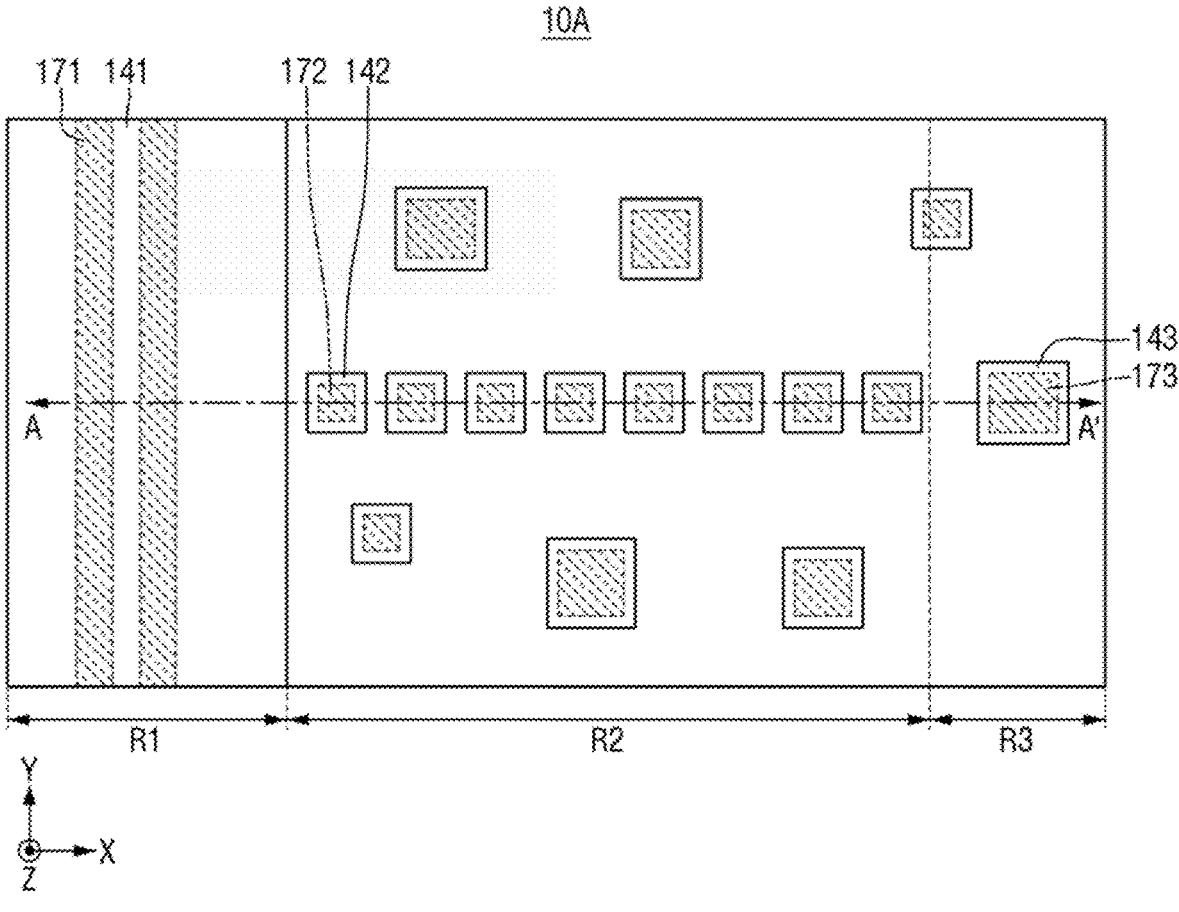
FIG. 3 is an illustrative plan view of a semiconductor memory device in accordance with example embodiments.
Figure 4:
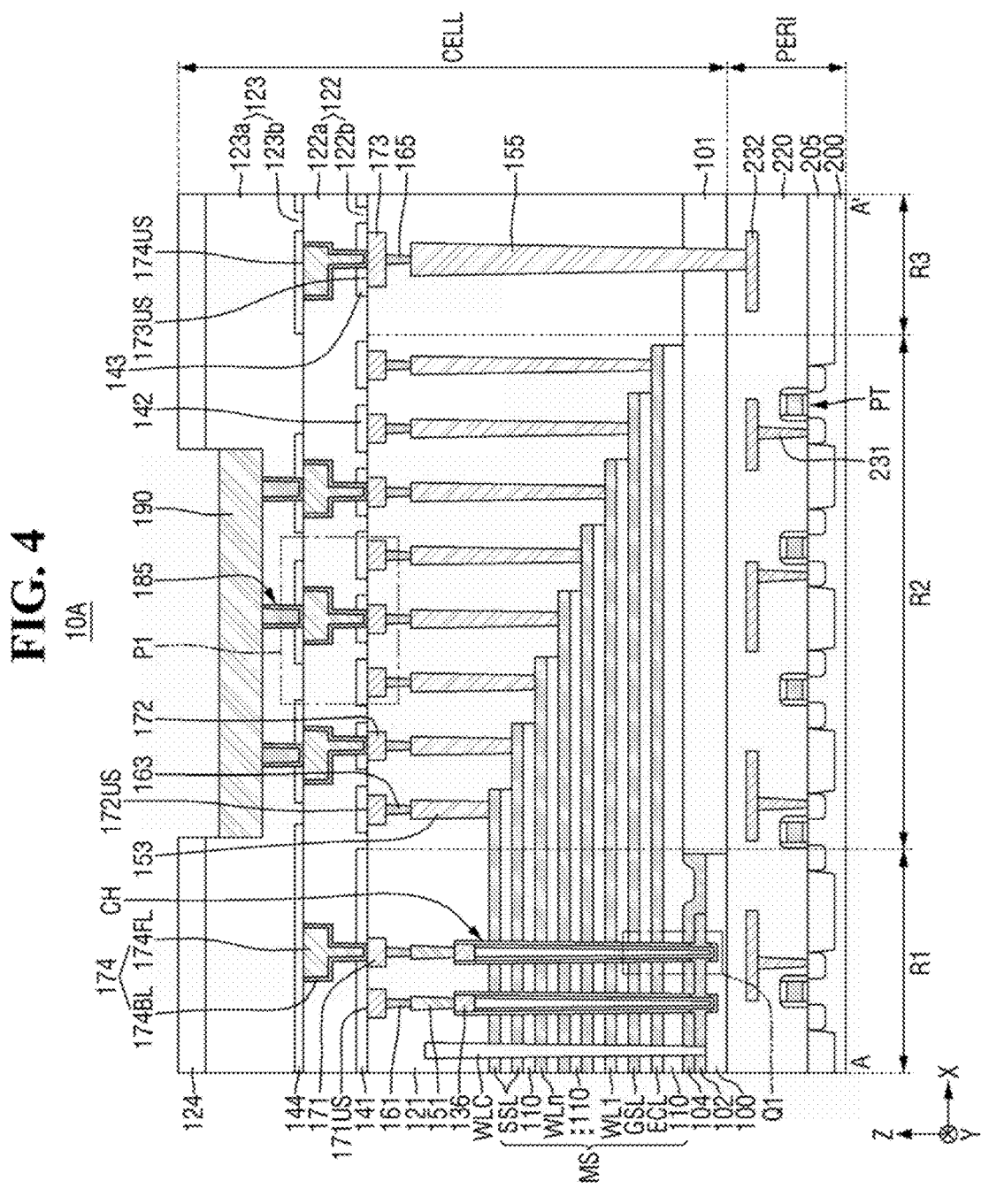
FIG. 4 is an illustrative cross-sectional view cut along a line A-A' in FIG. 3.
Figure 5:
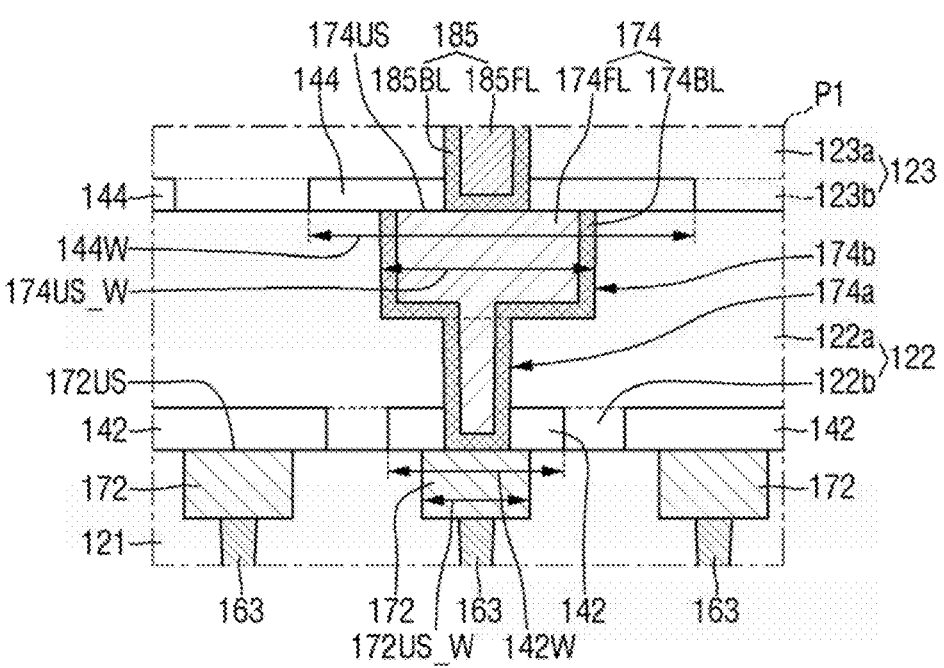
FIG. 5 is an enlarged view of a P1 area in FIG. 4.
Figure 6:
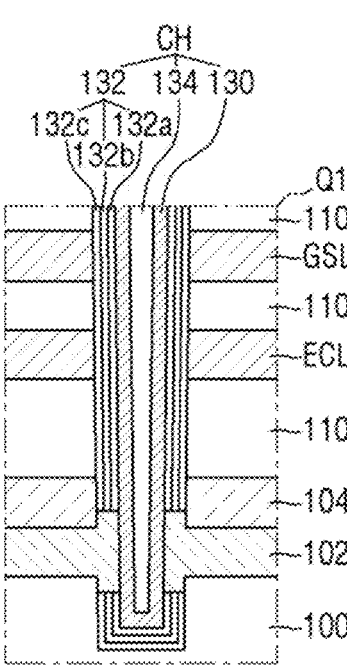
FIG. 6 is an enlarged view of a Q1 area in FIG. 4.

FIG. 3 is an illustrative plan view of a semiconductor memory device in accordance with example embodiments. FIG. 4 is an illustrative cross-sectional view cut along a line A-A' in FIG. 3. FIG. 5 is an enlarged view of a P1 area in FIG. 4. FIG. 6 is an enlarged view of a Q1 area in FIG. 4. For reference, FIG. 3 may be an illustrative plan view for illustrating first to third metal patterns 171, 172, and 173 and first to third blocking patterns 141, 142, and 143 of a semiconductor memory device according to some embodiments of the present disclosure. Referring to FIG. 3 to FIG. 6, a semiconductor memory device 10A according to some embodiments may include a cell structure CELL and a peripheral structure PERI.

In some embodiments, the cell structure CELL may include a cell substrate 100, a mold structure MS, a first interlayer insulating film 121, a second interlayer insulating film 122, a third interlayer insulating film 123, a channel structure CH, a word-line cutting structure WLC, the plurality of first metal patterns 171, the plurality of second metal patterns 172, the plurality of third metal patterns 173, a plurality of fourth metal patterns 174b, a plurality of cell contacts 153, a through-contact 155, the first blocking pattern 141, the plurality of second blocking patterns 142, the plurality of third blocking patterns 143, and a plurality of fourth blocking patterns 144.

The semiconductor memory device according to some embodiments may include a cell array area R1, an extension area R2, and a pad area R3. The cell array area R1, the extension area R2, and the pad area R3 may be connected to each other.

A memory cell array including a plurality of memory cells (e.g., 20 in FIG. 1) may be in the cell array area R1. In an implementation, the channel structure CH, the plurality of first metal patterns 171 and a gate electrodes ECL, GSL, WL1 to WLn, and SSL may be in the cell array area R1.

The extension area R2 may be around the cell array area R1. In the extension area R2, the gate electrodes ECL, GSL, WL1 to WLn, and SSL as described later may be stacked in a stair shape. Further, in the extension area R2, the plurality of cell contacts 153 may be disposed as described below.

The pad area R3 may be disposed inwardly of the cell array area R1 and the extension area R2 or may be disposed outwardly of the cell array area R1 and the extension area R2. In the pad area R3, the through-contact 155 or the like to be described later may be disposed.

A substrate may include the cell array area R1, the extension area R2, and the pad area R3. The substrate may include the cell substrate 100 and an insulating pattern 101.

The cell substrate 100 may include, e.g., a semiconductor substrate such as a silicon substrate, a germanium substrate, or a silicon-germanium substrate. Alternatively, the cell substrate 100 may include a silicon-on-insulator (SOI) substrate or a germanium-on-insulator (GOI) substrate. In some embodiments, the cell substrate 100 may contain impurities. In an implementation, the cell substrate 100 may contain n-type impurities such as phosphorus (P) or arsenic (As).

The insulating pattern 101 may be in the extension area R2 and the pad area R3. The insulating pattern 101 may include, e.g., silicon oxide, silicon nitride, silicon oxynitride, or silicon carbide. The insulating pattern 101 may be in the cell substrate 100.

The mold structure MS may be on a front surface (e.g., an upper surface) of the cell substrate 100. The mold structure MS may include the plurality of gate electrodes ECL, GSL, WL1 to WLn, and SSL, and a plurality of mold insulating films 110 that may be alternately stacked on top of each other while being on the cell substrate 100. Each of the gate electrodes ECL, GSL, WL1 to WLn, and SSL and each of the mold insulating films 110 may have a layered structure extending in a parallel manner with the upper surface of the cell substrate 100. The gate electrodes ECL, GSL, WL1 to WLn, and SSL may be sequentially stacked on the cell substrate 100 while being spaced apart from each other via each of the mold insulating films 110.

The gate electrodes ECL, GSL, WL1 to WLn, and SSL may be stacked in a stair shape in the extension area R2. In an implementation, the gate electrodes ECL, GSL, WL1 to WLn, and SSL may extend so as to have different lengths in the first direction X and thus may be stacked in the stair shape. In some embodiments, the gate electrodes ECL, GSL, WL1 to WLn, and SSL may extend so as to have different lengths in the second direction Y and thus may be stacked in the stair shape. Accordingly, a portion of each of the gate electrodes ECL, GSL, WL1 to WLn, and SSL may not be covered with other gate electrodes to be exposed. The exposed portion of each of the gate electrodes ECL, GSL, WL1 to WLn, and SSL may contact each of the plurality of cell contacts 153.

In some embodiments, the gate electrodes ECL, GSL, WL1 to WLn, and SSL may include the erase control line ECL, the ground select line GSL, and the plurality of word-lines WL1 to WLn sequentially stacked on the cell substrate 100. In some further embodiments, the erase control line ECL may be omitted.

The mold insulating films 110 may be stacked in a stepped manner in the extension area R2. In an implementation, the mold insulating films 110 may extend so as to have different lengths in the first direction X and thus may be stacked in the stepped manner. In some embodiments, the mold insulating films 110 may extend so as to have different lengths in the second direction Y and thus may be stacked in the stepped manner.

Each of the gate electrodes ECL, GSL, WL1 to WLn, and SSL may include a conductive material, e.g., a metal such as tungsten (W), cobalt (Co), or nickel (Ni), or a semiconductor material such as silicon. In one example, each of the gate electrodes ECL, GSL, WL1 to WLn, and SSL may include tungsten (W). Each of the gate electrodes ECL, GSL, WL1 to WLn, and SSL may have a multi-layer structure. In an implementation, when each of the gate electrodes ECL, GSL, WL1 to WLn, and SSL may have the multi-layer structure, each of the gate electrodes ECL, GSL, WL1 to WLn, and SSL may include a gate electrode barrier film and a gate electrode filling film. The gate electrode barrier film may include, e.g., titanium nitride (TiN), and the gate electrode filling film may include tungsten (W).

The mold insulating film 110 may include an insulating material, e.g., silicon oxide, silicon nitride, or silicon oxynitride. In one example, the mold insulating film 110 may include silicon oxide.

The channel structure CH may be in the mold structure MS and in the cell array area R1. The channel structure CH may extend in a vertical direction (hereinafter referred to as the third direction Z) intersecting the first surface of the cell substrate 100 and may extend through the mold structure MS. In an implementation, the channel structure CH may have a pillar shape (e.g., a cylinder shape) extending in the third direction Z. Accordingly, the channel structure CH may intersect each of the gate electrodes ECL, GSL, WL1 to WLn, and SSL.

The channel structure CH may include a semiconductor pattern 130 and an information storage film 132.

The semiconductor pattern 130 may extend in the third direction Z and extend through the mold structure MS. In an implementation, the semiconductor pattern 130 may have various shapes such as a cylindrical shape, a square column shape, and a solid pillar shape. The semiconductor pattern 130 may include, e.g., a semiconductor material such as monocrystalline silicon, polycrystalline silicon, an organic semiconductor material, or a carbon nanostructure.

The information storage film 132 may be between the semiconductor pattern 130 and each of the gate electrodes ECL, GSL, WL1 to WLn, and SSL. In an implementation, the information storage film 132 may extend along an outer surface of the semiconductor pattern 130. The information storage film 132 may include, e.g., silicon oxide, silicon nitride, silicon oxynitride, or a high dielectric constant (high-k) material having a higher dielectric constant than that of silicon oxide. The high dielectric constant (high-k) material may include, e.g., aluminum oxide, hafnium oxide, lanthanum oxide, tantalum oxide, titanium oxide, lanthanum hafnium oxide, lanthanum aluminum oxide, or dysprosium scandium oxide.

In some embodiments, the information storage film 132 may be a stack of multiple films. In an implementation, as shown in FIG. 6, the information storage film 132 may include a tunnel insulating film 132a, a charge storage film 132b, and a blocking insulating film 132c sequentially stacked on the outer surface of the semiconductor pattern 130.

The tunnel insulating film 132a may include, e.g., silicon oxide or a high-k material having a higher dielectric constant than that of silicon oxide, such as aluminum oxide ($Al_2O_3$) or hafnium oxide ($HfO_2$). The charge storage film 132b may include, e.g., silicon nitride. The blocking insulating film 132c may include, e.g., silicon oxide or a high-k material having a higher dielectric constant than that of silicon oxide, such as aluminum oxide ($Al_2O_3$) or hafnium oxide ($HfO_2$).

In some embodiments, the channel structure CH may further include a filling pattern 134. The filling pattern 134 may fill an inner space defined by the cup-shaped semiconductor pattern 130. The filling pattern 134 may include an insulating material, e.g., silicon oxide.

In some embodiments, the channel structure CH may further include a channel pad 136. The channel pad 136 may be connected to the semiconductor pattern 130. In an implementation, the channel pad 136 may be in the first interlayer insulating film 121 to be described later and may be connected to a top of the semiconductor pattern 130. The channel pad 136 may include, e.g., polysilicon doped with impurities.

In some embodiments, a source layer 102 and a source support layer 104 may be sequentially formed on the cell substrate 100. The source layer 102 and the source support layer 104 may be between the cell substrate 100 and the mold structure MS. In an implementation, the source layer 102 and the source support layer 104 may extend along the upper surface of the cell substrate 100.

In some embodiments, the source layer 102 may be connected to the semiconductor pattern 130 of the channel structure CH. In an implementation, as shown in FIG. 6, the source layer 102 may extend through the information storage film 132 and contact the semiconductor pattern 130. The source layer 102 may be provided as a common source line (e.g., CSL in FIG. 2) of the semiconductor memory device. The source layer 102 may include, e.g., impurity-doped polysilicon or a metal.

In some embodiments, the channel structure CH may extend through the source layer 102 and the source support layer 104. In an implementation, a bottom of the channel structure CH may extend through the source layer 102 and the source support layer 104 and be buried in the cell substrate 100. In some embodiments, the source support layer 104 may be used as a support layer to prevent the mold stack from collapsing in a replacement process for forming the source layer 102.

A base insulating film may be between the cell substrate 100 and the source layer 102. The base insulating film may include, e.g., silicon oxide, silicon nitride, or silicon oxynitride.

In some embodiments, the insulating pattern 101 may be in the extension area R2 and the pad area R3. An upper surface of the insulating pattern 101 may be coplanar with a upper surface of the source support layer 104. In another example, a vertical level of the upper surface of the insulating pattern 101 may be higher than that of the upper surface of the source support layer 104.

The word-line cutting structure WLC may cut the mold structure MS. The mold structure MS may be cut by the word-line cutting structure WLC divided into portions respectively constituting a plurality of memory cell blocks (e.g., BLK1 to BLKn in FIG. 1). In an implementation, two adjacent word-line cutting structures WLC may define one memory cell block therebetween. A plurality of channel structures CH may be in each of the memory cell blocks defined by the word-line cutting structures WLC.

In some embodiments, the word-line cutting structure WLC may cut the source layer 102 and the source support layer 104. A bottom surface of the word-line cutting structure WLC may be coplanar with a bottom surface of the source layer 102. In another example, a vertical level of the bottom surface of the word-line cutting structure WLC may be lower than that of the bottom surface of the source layer 102.

In some embodiments, the word-line cutting structure WLC may include an insulating material. In an implementation, the insulating material may fill the word-line cutting structure WLC. The insulating material may include, e.g., silicon oxide, silicon nitride, or silicon oxynitride.

A string isolation structure may be in the mold structure MS. The string isolation structure may cut the string select line SSL. The string isolation structure may divide each of the memory cell blocks defined by the word-line cutting structures WLC into portions respectively constituting a plurality of string areas. In an implementation, the string isolation structure may define two string areas in one memory cell block.

The first interlayer insulating film 121 may be on the mold structure MS. The first interlayer insulating film 121 may cover the plurality of channel structures CH, the plurality of cell contacts 153, and the through-contact 155. The first interlayer insulating film 121 may include an oxide-based insulating material. The first interlayer insulating film 121 may include, e.g., silicon oxide, silicon oxynitride, or a low-k material with a lower dielectric constant than that of silicon oxide.

The plurality of first metal patterns 171 may be on the substrate and in the cell array area R1. The plurality of first metal patterns 171 may be on the mold structure MS. The plurality of first metal patterns 171 may act as bit-lines (BL in FIG. 2) of the semiconductor memory device. The plurality of first metal patterns 171 may be in the first interlayer insulating film 121. The plurality of first metal patterns 171 may extend in the second direction Y.

Further, the plurality of first metal patterns 171 may be respectively connected to the plurality of channel structures CH. In an implementation, first and second bit-line contacts 151 and 161 connected to a top of each of the channel structures CH may be in the first interlayer insulating film 121 The first bit-line contact 151 may be on the channel structure CH. The first bit-line contact 151 may be connected to the channel pad 136. The second bit-line contact 161 may be on the first bit-line contact 151. The second bit-line contact 161 may be connected to each of the plurality of first metal patterns 171. The second bit-line contact 161 may be between each of the first metal patterns 171 and the first bit-line contact 151. Each of the plurality of first metal patterns 171 may be electrically connected to each of the channel structures CH via the first and second bit-line contacts 151 and 161.

Each of the plurality of first metal patterns 171 may include a conductive material. In an implementation, each of the plurality of first metal patterns 171 may include tungsten (W) or copper (Cu).

The plurality of cell contacts 153 may be on the substrate and in the extension area R2. The plurality of cell contacts 153 may be in the extension area R2 and may extend in the third direction Z and may extend through the first interlayer insulating film 121. Each of the plurality of cell contacts 153 may be connected to one of the plurality of gate electrodes. In an implementation, each of the plurality of cell contacts 153 may land on the topmost gate electrode among the plurality of gate electrodes. In an implementation, each of the plurality of cell contacts 153 may be electrically connected to the topmost gate electrode among the plurality of gate electrodes.

All of upper surfaces of the plurality of cell contacts 153 may be coplanar with each other. Further, all of bottom surfaces of the plurality of cell contacts 153 may be coplanar with each other.

The plurality of second metal patterns 172 may be on the substrate and in the extension area R2. The plurality of second metal patterns 172 may be on the mold structure MS. An upper surface 172US of each of the plurality of second metal patterns 172 may be coplanar with an upper surface 171US of each of the plurality of first metal patterns 171. The upper surface 172US of each of the plurality of second metal patterns 172 may be coplanar with an upper surface of the first interlayer insulating film 121. Further, the plurality of second metal patterns 172 may be respectively connected to the plurality of cell contacts 153. In an implementation, a first via contact 163 may be between each of the plurality of second metal patterns 172 and each of the cell contacts 153. Each of the plurality of second metal patterns 172 and each of the cell contacts 153 may be electrically connected to each other via each first via contact 163.

Each of the plurality of second metal patterns 172 may include a conductive material. In an implementation, each of the plurality of second metal patterns 172 may include tungsten (W) or copper (Cu).

The through-contact 155 may be on the substrate and in the pad area R3. The through-contact 155 may be in the pad area R3 and may extend in the third direction Z and may extend through the first interlayer insulating film 121. Further, the through-contact 155 may extend through the insulating pattern 101. The through-contact 155 may extend through the insulating pattern 101 and then be connected to a peripheral circuit element PT of the peripheral circuit structure PERI, which will be described later. In an implementation, the through-contact 155 may be connected to a wiring structure 232.

The plurality of third metal patterns 173 may be on the substrate and in the pad area R3. The plurality of third metal patterns 173 may be in the first interlayer insulating film 121. A upper surface 173US of each of the plurality of third metal patterns 173 may be coplanar with the upper surface 171US of each of the plurality of first metal patterns 171 and the upper surface 172US of each of the plurality of second metal patterns 172. The upper surface 173US of each of the plurality of third metal patterns 173 may be coplanar with the upper surface of the first interlayer insulating film 121. Further, some of the plurality of third metal patterns 173 may be connected to the through-contact 155. In an implementation, a second via contact 165 may be between some of the plurality of third metal patterns 173 and the through-contact 155. Some of the plurality of third metal patterns 173 and the through-contact 155 may be electrically connected to each other via the second via contact 165.

Each of the plurality of third metal patterns 173 may include a conductive material. In an implementation, each of the plurality of third metal patterns 173 may include tungsten (W) or copper (Cu).

The first blocking pattern 141 may be on the substrate and in the cell array area R1. The first blocking pattern 141 may be on the first interlayer insulating film 121. The first blocking pattern 141 may cover an entirety of the upper surface 171US of each of the plurality of first metal patterns 171. The first blocking pattern 141 may entirely overlap the upper surface 171US of each of the plurality of first metal patterns 171 in a thickness direction of the substrate, e.g., in the third direction Z. Further, the first blocking pattern 141 may entirely overlap with a portion of the substrate in the cell array area R1 in the third direction Z.

The plurality of second blocking patterns 142 may be on the substrate and in the extension area R2. The plurality of second blocking patterns 142 may be spaced apart from each other. An insulating material may be between adjacent ones of the plurality of second blocking patterns 142. In an implementation, a silicon oxide film may be between adjacent ones of the plurality of second blocking patterns 142. The silicon oxide film may be a portion of the second interlayer insulating film 122 to be described later. In an implementation, the silicon oxide film may be a second portion 122*b* of the second interlayer insulating film 122. Each of the plurality of second blocking patterns 142 may cover an entirety of the upper surface 172US of each of the plurality of second metal patterns 172. Each of the plurality of second blocking patterns 142 may entirely overlap the upper surface 172US of each of the plurality of second metal patterns 172 in the third direction Z.

In an implementation, in FIG. 5, a width 142W of each of the second blocking pattern 142 may be greater than a width 172US_W of the upper surface 172US of each of the second metal pattern 172 corresponding to the second blocking pattern 142. In other words, a spacing in the first direction X between adjacent second blocking patterns 142 may be smaller than a spacing in the first direction X between adjacent second metal patterns 172.

The plurality of third blocking patterns 143 may be on the substrate and in the pad area R3. The plurality of third blocking patterns 143 may be spaced apart from each other. An insulating material may be between adjacent ones of the plurality of third blocking patterns 143. In an implementation, a silicon oxide film may be between adjacent ones of the plurality of third blocking patterns 143. The silicon oxide film may be a portion of the second interlayer insulating film 122 to be described later. In an implementation, the silicon oxide film may be the second portion 122*b* of the second interlayer insulating film 122. Each of the plurality of third blocking patterns 143 may entirely cover the upper surface 173US of each of the plurality of third metal patterns 173. Each of the plurality of third blocking patterns 143 may overlap an entirety of the upper surface 173US of each of the plurality of third metal patterns 173 in the third direction Z.

Each of the first to third blocking patterns 141, 142, and 143 may include a nitride-based insulating material. In an implementation, each of the first to third blocking patterns 141, 142, and 143 may be embodied as a silicon nitride layer.

In some embodiments, an area between adjacent ones of the plurality of second blocking patterns 142, an area between adjacent ones of the plurality of third blocking patterns 143, and/or an area between the second blocking pattern 142 and the third blocking pattern 143 may be filled with an oxide-based insulating material. Hydrogen can migrate through each of the areas. In an implementation, hydrogen in the second interlayer insulating film 122 may migrate more easily to the first interlayer insulating film 121. Accordingly, the semiconductor memory device with improved reliability may be implemented.

The second interlayer insulating film 122 may be on the first interlayer insulating film 121. The second interlayer insulating film 122 may be on the plurality of first metal patterns 171, the plurality of second metal patterns 172, and the plurality of third metal patterns 173. The second interlayer insulating film 122 may include a first portion 122*a* and the second portion 122*b*. The second portion 122*b* of the second interlayer insulating film 122 may be between adjacent ones of the plurality of second blocking patterns 142, between adjacent ones of the plurality of third blocking patterns 143, and/or between the second blocking pattern 142 and the third blocking pattern 143. The first portion 122*a* of the second interlayer insulating film 122 may be on the first to third blocking patterns 141, 142, and 143. In an implementation, the second portion 122*b* of the second interlayer insulating film 122 may be between the first interlayer insulating film 121 and the first portion 122*a* of the second interlayer insulating film 122.

The second interlayer insulating film 122 may include an oxide-based insulating material. The second interlayer insulating film 122 may include, e.g., silicon oxide, silicon oxynitride, or a low-k material with a lower dielectric constant than that of silicon oxide. In some embodiments, a concentration of hydrogen in the second interlayer insulating film 122 may be greater than a concentration of hydrogen in the first interlayer insulating film 121.

In some embodiments, a metal layer 174 may be in the second interlayer insulating film 122. The metal layer 174 may be connected to the plurality of first metal patterns 171, the plurality of second metal patterns 172, and the plurality of third metal patterns 173. Further, the metal layer 174 may be connected to a pad pattern 190 to be described later. In an implementation, one end of the metal layer 174 may be connected to the pad pattern 190, while the other end of the metal layer 174 may be connected to the plurality of first metal patterns 171, the plurality of second metal patterns 172, and the plurality of third metal patterns 173.

The metal layer 174 may include a fourth metal pattern 174*b* and a via 174*a*. The fourth metal pattern 174*b* may be in the second interlayer insulating film 122. A upper surface 174US of the fourth metal pattern 174*b* may be at the same vertical level as that of a upper surface of the second interlayer insulating film 122. The via 174*a* may be under the fourth metal pattern 174*b*. The via 174*a* may be between the fourth metal pattern 174*b* and the first interlayer insulating film 121. A width of the fourth metal pattern 174*b* may be greater than a width of the via 174*a*.

In some embodiments, the metal layer 174 may be embodied as a stack of multiple films. In an implementation, the metal layer 174 may include a barrier film 174BL and a filling film 174FL. The filling film 174FL of the metal layer 174 may be a 'T' shape. The barrier film 174BL of the metal layer 174 may be between the filling film 174FL of the metal layer 174 and the second interlayer insulating film 122.

The barrier film 174BL of the metal layer 174 may include metal, metal nitride, metal carbonitride, or a two-dimensional (2D) material. In an implementation, the two-dimensional material may be a metallic material and/or a semiconductor material. The 2D material may include a 2D allotrope or a 2D compound. In one example, the barrier film 174BL of the metal layer 174 may include titanium nitride (TiN). The filling film 174FL of the metal layer 174 may include a metal such as tungsten (W), cobalt (Co), nickel (Ni), or copper (Cu). In one example, the filling film 174FL of the metal layer 174 may include copper (Cu).

The plurality of fourth blocking patterns 144 may be on the metal layer 174. The plurality of fourth blocking patterns 144 may be spaced apart from each other. An insulating material may be between adjacent ones of the plurality of fourth blocking patterns 144. In an implementation, a silicon oxide film may be between adjacent ones of the plurality of fourth blocking patterns 144. The silicon oxide film may be a portion of the third interlayer insulating film 123 to be described later. In an implementation, the silicon oxide film may be a second portion 123*b* of the third interlayer insulating film 123. Each of the plurality of fourth blocking patterns 144 may entirely cover the upper surface 174US of each of the plurality of fourth metal patterns 174b. Each of the plurality of fourth blocking patterns 144 may overlap an entirety of the upper surface 174US of each of the plurality of fourth metal patterns 174b in the third direction Z.

In an implementation, in FIG. 5, a width 144W of each of the fourth blocking pattern 144 may be greater than a width 174US_W of the upper surface 174US of the fourth metal pattern 174b corresponding to the fourth blocking pattern 144. In other words, a spacing in the first direction X between adjacent fourth blocking patterns 144 may be smaller than a spacing in the first direction X between adjacent fourth metal patterns 174b.

Each of the plurality of fourth blocking patterns 144 may include a nitride-based insulating material. In an implementation, each of the plurality of fourth blocking patterns 144 may be embodied as a silicon nitride layer.

In some embodiments, an area between adjacent ones of the plurality of fourth blocking patterns 144 may be filled with an oxide-based insulating material. Thus, hydrogen may migrate through the area. In an implementation, hydrogen in the third interlayer insulating film 123 may migrate more easily to the second interlayer insulating film 122. Accordingly, the semiconductor memory device with improved reliability may be implemented.

The third interlayer insulating film 123 may be on the second interlayer insulating film 122. The third interlayer insulating film 123 may be on a plurality of metal layers 174. The third interlayer insulating film 123 may include a first portion 123a and the second portion 123b. The second portion 123b of the third interlayer insulating film 123 may be between adjacent ones of the plurality of fourth blocking patterns 144. The first portion 123a of the third interlayer insulating film 123 may be on the fourth blocking pattern 144. In an implementation, the second portion 123b of the third interlayer insulating film 123 may be between the second interlayer insulating film 122 and the first portion 123a of the third interlayer insulating film 123. The third interlayer insulating film 123 may include an oxide-based insulating material. The third interlayer insulating film 123 may include, e.g., silicon oxide, silicon oxynitride, or a low-k material with a lower dielectric constant than that of silicon oxide. In some embodiments, a concentration of hydrogen in the third interlayer insulating film 123 may be greater than a concentration of hydrogen in the second interlayer insulating film 122.

In some embodiments, a pad via 185 may be in the third interlayer insulating film 123. The pad via 185 may be connected to the metal layer 174. Further, the pad via 185 may be connected to the pad pattern 190. In some embodiments, the pad via 185 may be embodied as a stack of multiple films. In an implementation, the pad via 185 may include a barrier film 185BL and a filling film 185FL. The barrier film 185BL of the pad via 185 may be disposed along a sidewall and a bottom surface of the filling film 185FL of the pad via 185. In an implementation, the barrier film 185BL of the pad via 185 may be between the filling film 185FL of the pad via 185 and the third interlayer insulating film 123.

The barrier film 185BL of the pad via 185 may include a metal, metal nitride, metal carbonitride, or a two-dimensional (2D) material. In an implementation, the two-dimensional material may be a metallic material and/or a semiconductor material. The 2D material 2D material may include a 2D allotrope or a 2D compound. In one example, the barrier film 185BL of the pad via 185 may include titanium nitride (TiN). The filling film 185FL of the pad via 185 may include a metal such as tungsten (W), cobalt (Co), nickel (Ni), or copper (Cu). In one example, the filling film 185FL of the pad via 185 may include copper (Cu).

In some embodiments, the semiconductor memory device 10A according to the present disclosure may further include the pad pattern 190 and a capping film 124. The capping film 124 may be on the third interlayer insulating film 123. The capping film 124 may protect the semiconductor memory device 10A according to the present disclosure. The capping film 124 may be embodied as a nitride-based insulating material.

The pad pattern 190 may be in the third interlayer insulating film 123. The pad pattern 190 may be connected to the pad via 185. In some embodiments, a upper surface of the pad pattern 190 may be exposed. The semiconductor memory device 10A according to the present disclosure and an external device may be electrically connected to each other via the exposed upper surface thereof. The pad pattern 190 may be made of a conductive material. In one example, the pad pattern 190 may be made of aluminum (Al).

In some embodiments, the peripheral circuit structure PERI may include a peripheral circuit substrate 200 and the peripheral circuit element PT. The peripheral circuit substrate 200 may be under the cell substrate 100. In an implementation, a upper surface of the peripheral circuit substrate 200 may face the bottom surface of the cell substrate 100. The peripheral circuit substrate 200 may include, e.g., a semiconductor substrate such as a silicon substrate, a germanium substrate, or a silicon-germanium substrate. Alternatively, the peripheral circuit substrate 200 may be embodied as a silicon-on-insulator (SOI) substrate or a germanium-on-insulator (GOI) substrate.

The peripheral circuit element PT may be on the peripheral circuit substrate 200. The peripheral circuit element PT may constitute a peripheral circuit (e.g., 30 in FIG. 1) that controls an operation of the semiconductor memory device. In an implementation, the peripheral circuit element PT may include control logic (e.g., 37 in FIG. 1), a row decoder (e.g., 33 in FIG. 1), or a page buffer (e.g., 35 in FIG. 1). In the following descriptions, a surface of the peripheral circuit substrate 200 on which the peripheral circuit element PT is disposed may be referred to as a front surface of the peripheral circuit substrate 200. Conversely, a surface of the peripheral circuit substrate 200 opposite to the front surface of the peripheral circuit substrate 200 may be referred to as a back surface or a rear surface of the peripheral circuit substrate 200.

The peripheral circuit element PT may include, e.g., a transistor. In an implementation, the peripheral circuit element PT may include not only various active elements such as a transistor, but also various passive elements such as a capacitor, a resistor, and an inductor.

In some embodiments, the rear surface of the cell substrate 100 may face the front surface of the peripheral circuit substrate 200. In an implementation, an inter-wiring insulating film 220 covering the peripheral circuit element PT may be on the front surface of the peripheral circuit substrate 200. The cell substrate 100 and/or the insulating pattern 101 may be stacked on a upper surface of the inter-wiring insulating film 220.

Some of the plurality of third metal patterns 173 may be connected to the peripheral circuit element PT via the through-contact 155. In an implementation, a plurality of wiring structures 232 connected to the peripheral circuit element PT may be in the inter-wiring insulating film 220. Each of the plurality of wiring structures 232 may be connected to the peripheral circuit element PT via each of a plurality of wiring contacts 231.

The through-contact 155 may extend through the first interlayer insulating film 121 and the insulating pattern 101 so as to connect the third metal patterns 173 and the wiring structure 232 to each other. Thus, the bit-line BL, each of the gate electrodes ECL, GSL, WL1 to WLn, and SSL, and/or the source layer 102 may be electrically connected to the peripheral circuit element PT.

The peripheral circuit elements PT may be isolated from each other via a peripheral element isolation film 205. In an implementation, the peripheral element isolation film 205 may be in the peripheral circuit substrate 200. The peripheral element isolation film 205 may be embodied as a shallow trench isolation (STI) film. The peripheral element isolation film 205 may define an active area of each of the peripheral circuit elements PT. The peripheral element isolation film 205 may include an insulating material. The peripheral element isolation film 205 may include, e.g., silicon nitride, silicon oxide, or silicon oxynitride.

Hereinafter, some further embodiments of a semiconductor memory device according to the present disclosure are described. For convenience of description, the following descriptions are based on differences thereof from those as set forth above with reference to FIG. 3 to FIG. 6.

Figure 7:
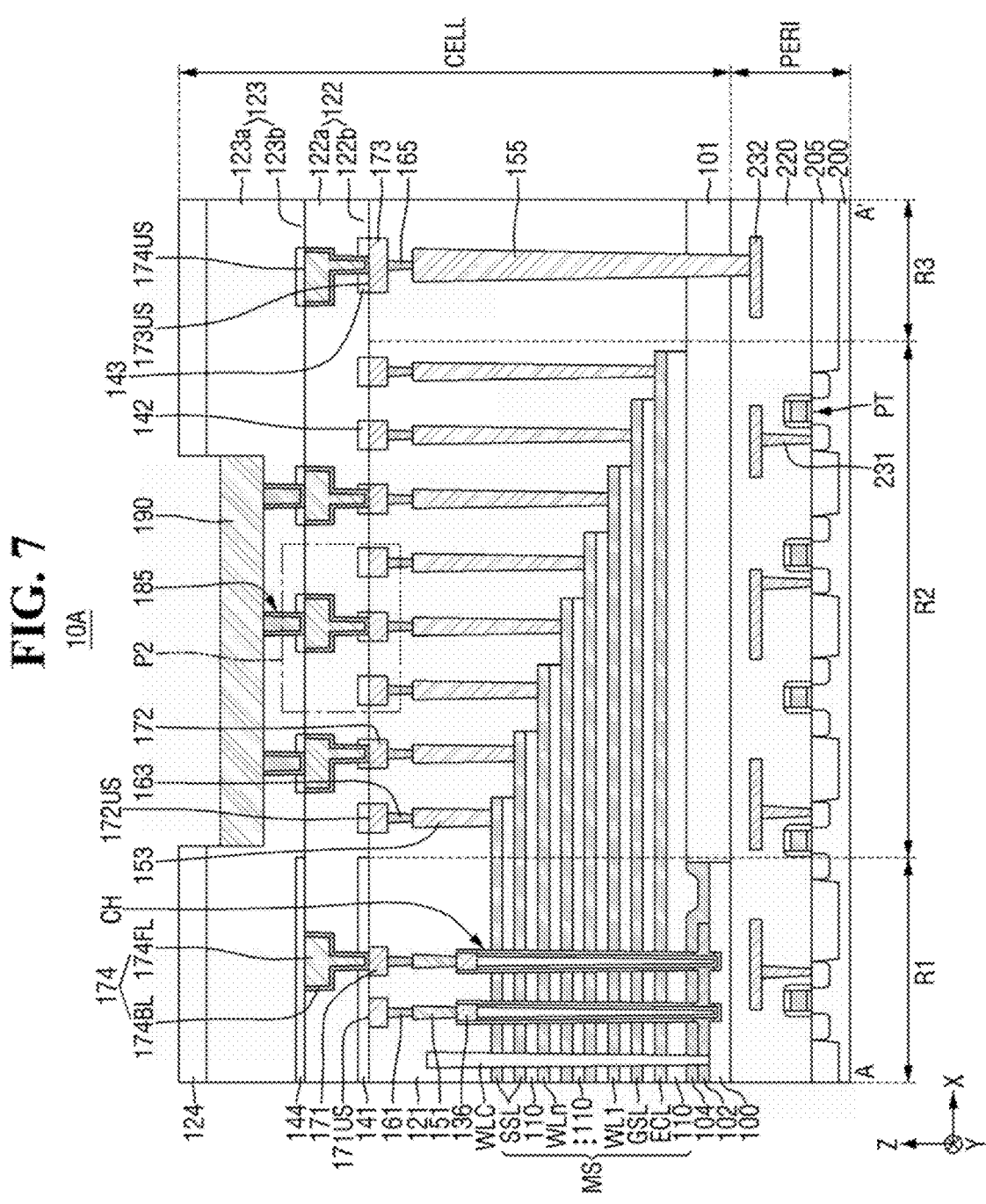
FIG. 7 is a diagram of a semiconductor memory device according to example embodiments.
Figure 8:
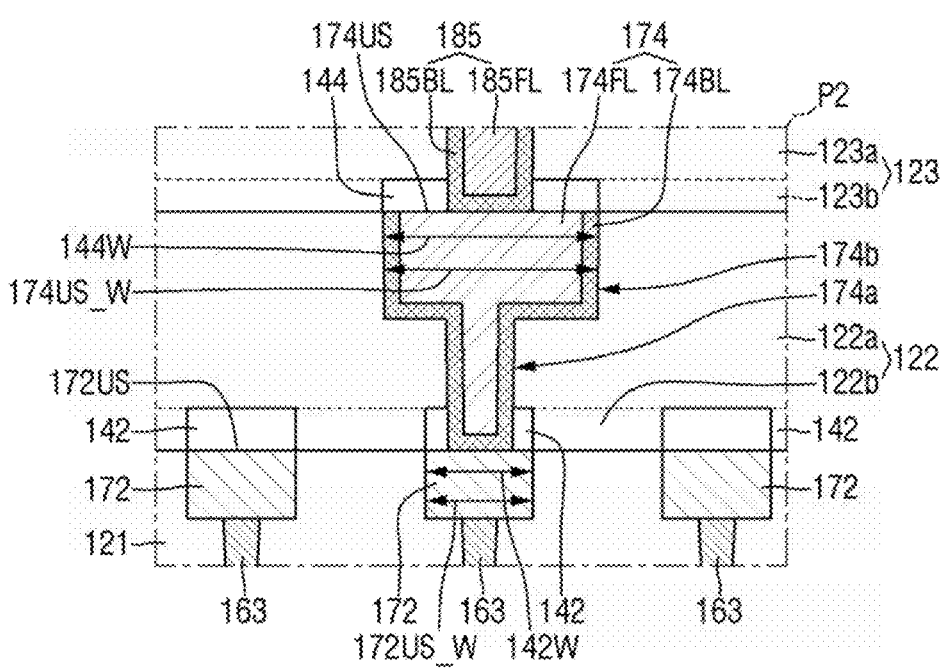
FIG. 8 is an enlarged view of a P2 area in FIG. 7.

FIG. 7 is a diagram of a semiconductor memory device according to example embodiments. FIG. 8 is an enlarged view of a P2 area in FIG. 7. Referring to FIGS. 7 and 8, in the semiconductor memory device 10A according to some further embodiments, the width 142W of each of the plurality of second blocking patterns 142 may be equal to the width 172US_W of the upper surface 172US of each of the second metal patterns 172 corresponding thereto. In an implementation, each of the plurality of second blocking patterns 142 may overlap an entirety of the upper surface 172US of each of the second metal patterns 172 corresponding thereto in the third direction Z. A spacing in the first direction X between adjacent ones of the plurality of second blocking patterns 142 may be equal to a spacing in the first direction X between adjacent ones of the plurality of second metal patterns 172.

Further, the width 144W of each of the plurality of fourth blocking patterns 144 may be equal to the width 174US_W of the upper surface 174US of each of the fourth metal patterns 174b corresponding thereto. In an implementation, each of the plurality of fourth blocking patterns 144 may overlap an entirety of the upper surface 174US of each of the fourth metal patterns 174b corresponding thereto in the third direction Z. A spacing in the first direction X between adjacent ones of the plurality of fourth blocking patterns 144 may be equal to a spacing in the first direction X between adjacent ones of the plurality of fourth metal patterns 174b.

Similarly, the width of each of the plurality of third blocking patterns 143 may be equal to the width of the upper surface 173US of each of the third metal patterns 173 corresponding thereto. In an implementation, each of the plurality of third blocking patterns 143 may overlap an entirety of the upper surface 173US of each of the third metal patterns 173 corresponding thereto in the third direction Z. A spacing between adjacent ones of the plurality of third blocking patterns 143 may be equal to a spacing between adjacent ones of the plurality of third metal patterns 173.

Figure 9:
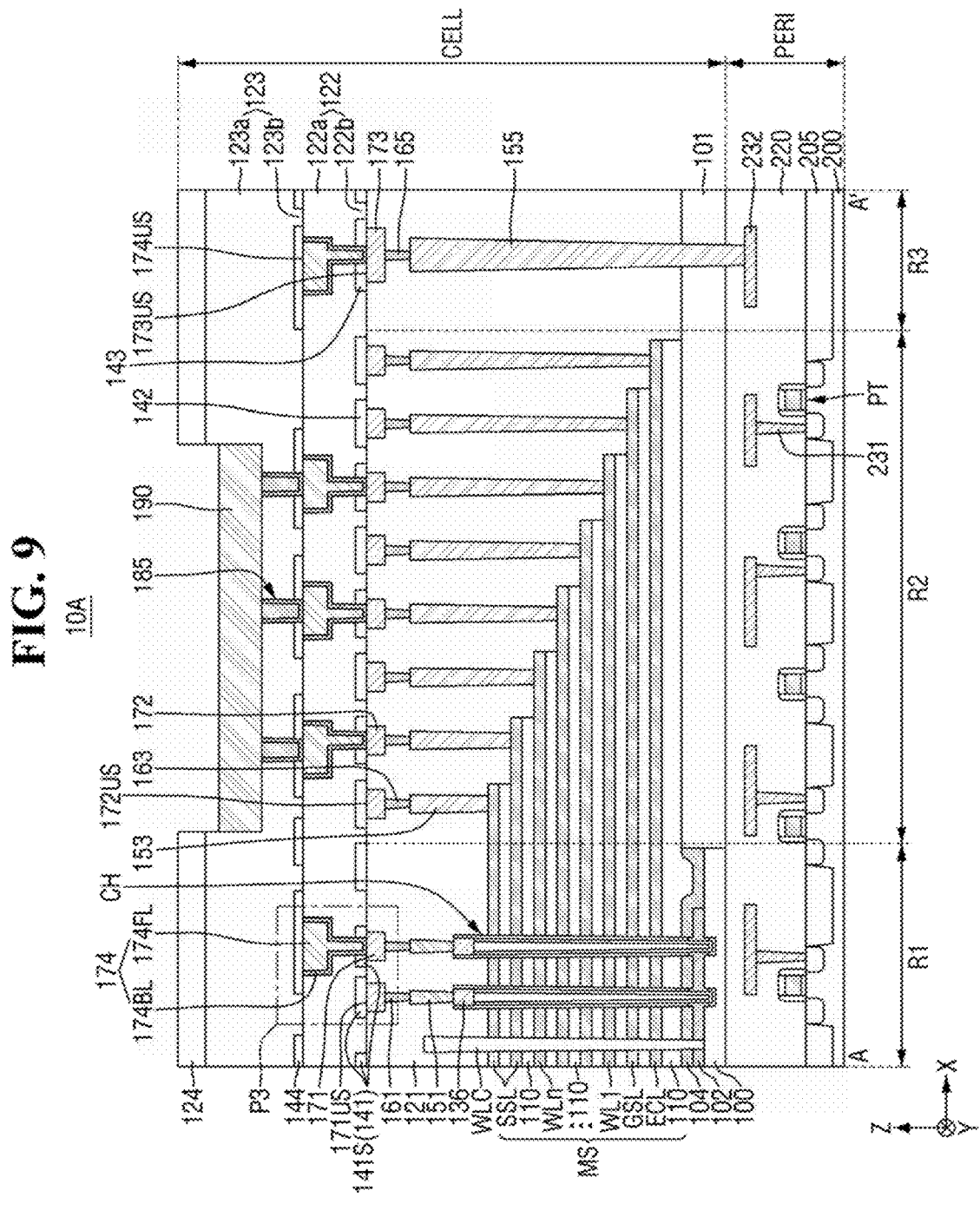
FIG. 9 is a diagram of a semiconductor memory device according to example embodiments.
Figure 10:
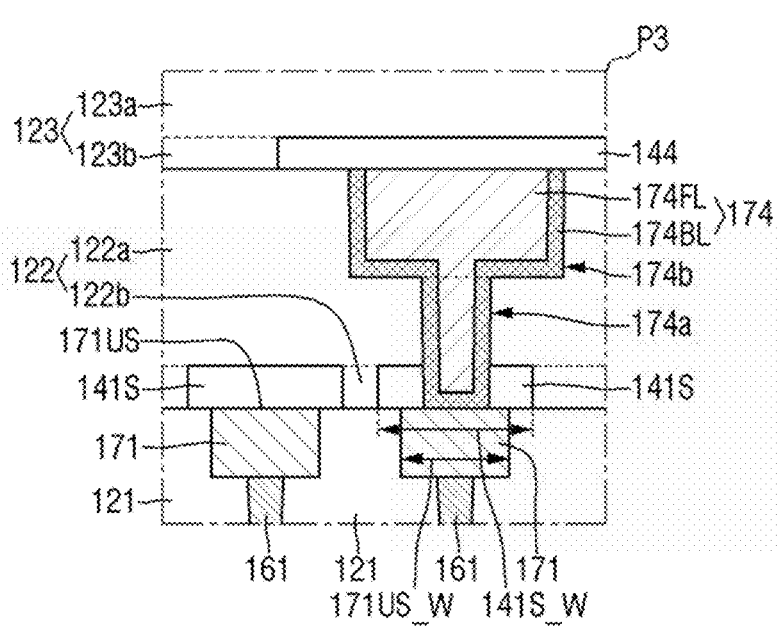
FIG. 10 is an enlarged view of a P3 area in FIG. 9.

FIG. 9 is a diagram of a semiconductor memory device according to example embodiments. FIG. 10 is an enlarged view of a P3 area in FIG. 9. Referring to FIG. 9 and FIG. 10, in the semiconductor memory device 10A according to some still further embodiments, the first blocking pattern 141 may include a plurality of sub-blocking patterns 141S. The plurality of sub-blocking patterns 141S may correspond to the plurality of first metal patterns 171. The plurality of sub-blocking patterns 141S may be spaced apart from each other. An insulating material may be between adjacent ones of the plurality of sub-blocking patterns 141S. In an implementation, a silicon oxide film may be between adjacent ones of the plurality of sub-blocking patterns 141S. The silicon oxide film may be a portion of the second interlayer insulating film 122. In an implementation, the silicon oxide film may be the second portion 122b of the second interlayer insulating film 122. Each of the plurality of sub-blocking patterns 141S may entirely cover the upper surface 171US of each of the plurality of first metal patterns 171. Each of the plurality of sub-blocking patterns 141S may overlap an entirety of the upper surface 171US of each of the plurality of first metal patterns 171 in the third direction Z.

In an implementation, in FIG. 9, a width 141S_W of each of the sub-blocking patterns 141S may be greater than the width 171US_W of the upper surface 171US of each of the first metal patterns 171 corresponding to each sub-blocking pattern 141S. In other words, a spacing in the first direction X between adjacent sub-blocking patterns 141S may be smaller than a spacing in the first direction X between adjacent first metal patterns 171.

The width 141S_W of each of the sub-blocking patterns 141S may be equal to the width 171US_W of the upper surface 171US of each of the first metal patterns 171 corresponding to each sub-blocking pattern 141S. In some embodiments, an area between adjacent ones of the plurality of sub-blocking patterns 141S may be filled with an oxide-based insulating material. Thus, hydrogen may migrate through the area. In an implementation, hydrogen in the second interlayer insulating film 122 may migrate more easily to the first interlayer insulating film 121. Accordingly, the semiconductor memory device with improved reliability may be implemented.

Figure 11:
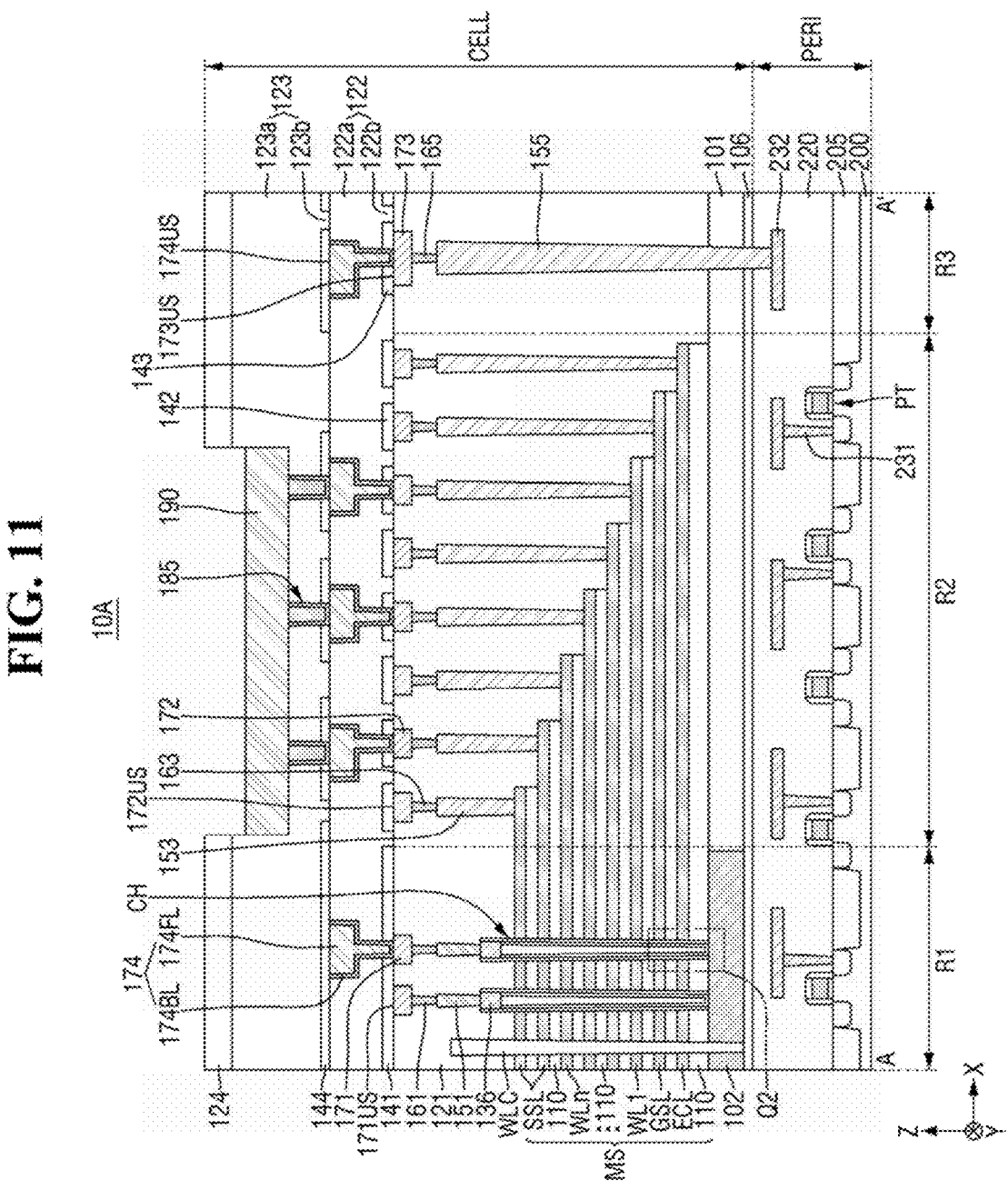
FIG. 11 is a diagram of a semiconductor memory device according to example embodiments.
Figure 12:
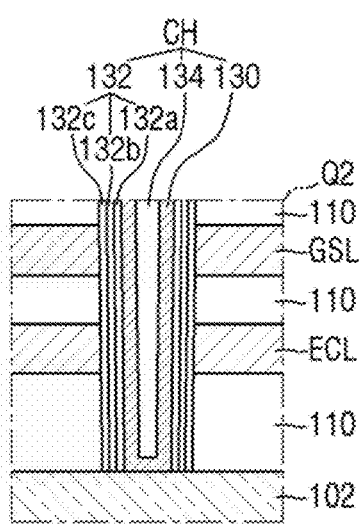
FIG. 12 is an enlarged view of a Q2 area in FIG. 11.

FIG. 11 is a diagram of a semiconductor memory device according to example embodiments. FIG. 12 is an enlarged view of a Q2 area in FIG. 11. Referring to FIGS. 11 and 12, in the semiconductor memory device 10A according to some still yet further embodiments, the source layer 102 may be connected to the semiconductor pattern 130.

The source layer 102 may contact a bottom surface of the information storage film 132 and a bottom surface of the semiconductor pattern 130. The source layer 102 may cover a sidewall of the semiconductor pattern 130. The source layer 102 may not cover the bottom surface of the semiconductor pattern 130. In this case, the source support layer 104 in FIG. 4 may not be provided.

In some embodiments, a metal silicide layer 106 may be under the source layer 102 and the insulating pattern 101. The metal silicide layer 106 may be between the source layer 102 and the inter-wiring insulating film 220, and between the insulating pattern 101 and the inter-wiring insulating film 220. Alternatively, the metal silicide layer 106 may not be provided.

Figure 13:
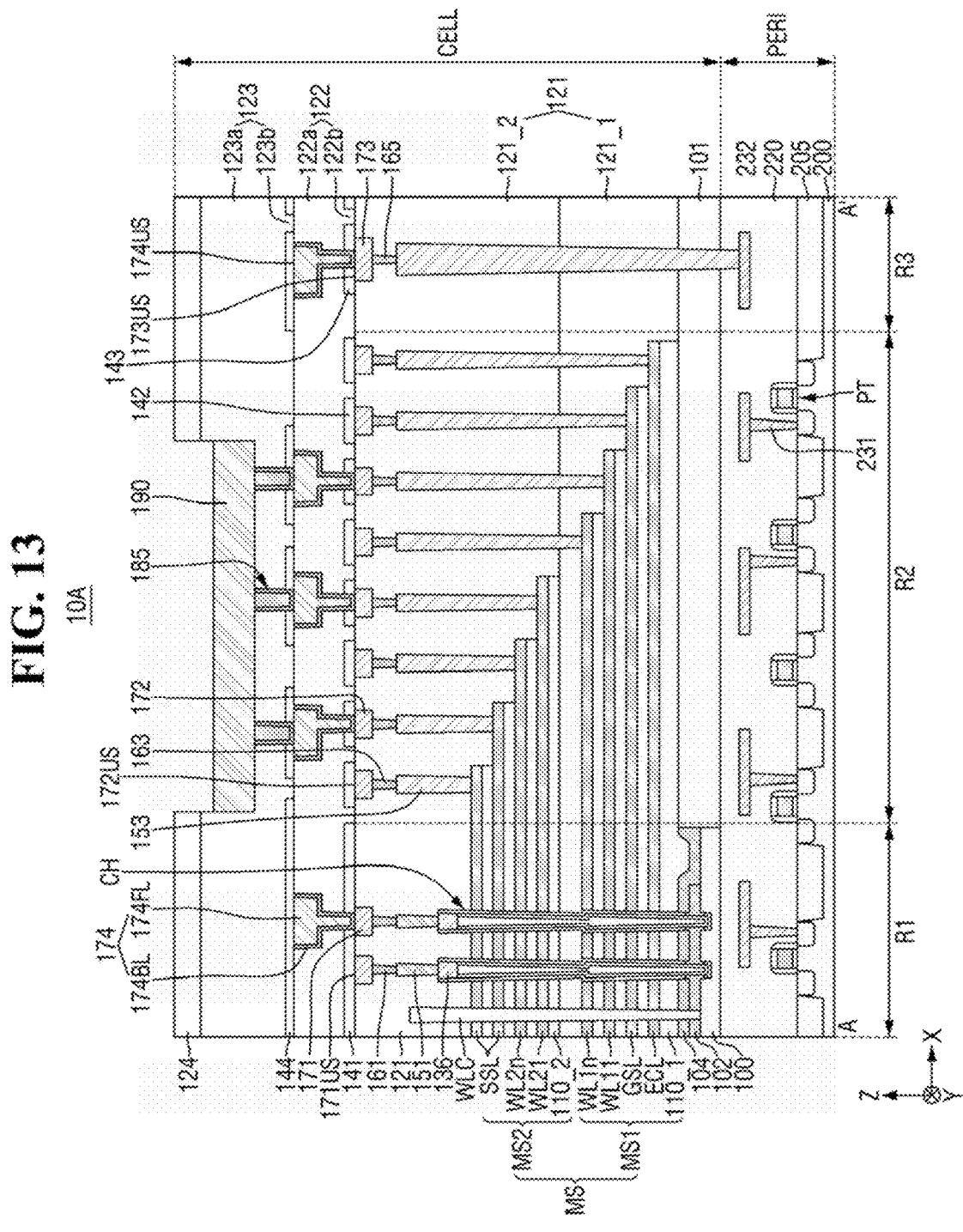
FIG. 13 is a diagram of a semiconductor memory device according to example embodiments.

FIG. 13 is a diagram of a semiconductor memory device according to example embodiments. Referring to FIG. 13, in the semiconductor memory device 10A according to some still yet further embodiments, the mold structure MS may include a lower mold structure MS1 and an upper mold structure MS2.

The first interlayer insulating film 121 may include a lower first interlayer insulating film 121_1 and an upper first interlayer insulating film 121_2. The mold insulating film 110 may include a lower mold insulating film 110_1 and an upper mold insulating film 110_2.

In some embodiments, the upper mold structure MS2 may be on the lower mold structure MS1. The lower mold structure MS1 may include lower gate electrodes ECL, GSL, and WL11 to WL1n and lower mold insulating films 110_1 alternately stacked on top of each other. The upper mold structure MS2 may be include upper gate electrodes WL21 to WL2n, and SSL, and upper mold insulating films 110_2 alternately stacked on top of each other. The channel structure CH may extend through the upper mold structure MS2 and the lower mold structure MS1 in the third direction Z.

In some embodiments, the lower first interlayer insulating film 121_1 may be between the lower gate electrode WL In and the upper mold insulating film 110_2. The upper first interlayer insulating film 121_2 may be between the upper gate electrodes SSL and the plurality of first metal patterns 171. Further, the upper first interlayer insulating film 121_2 may be on the lower first interlayer insulating film 121_1.

Hereinafter, a semiconductor memory device according to some still yet further embodiments of the present disclosure is described. For convenience of description, the following descriptions are based on differences thereof from those as set forth above with reference to FIG. 3 to FIG. 6.

Figure 14:
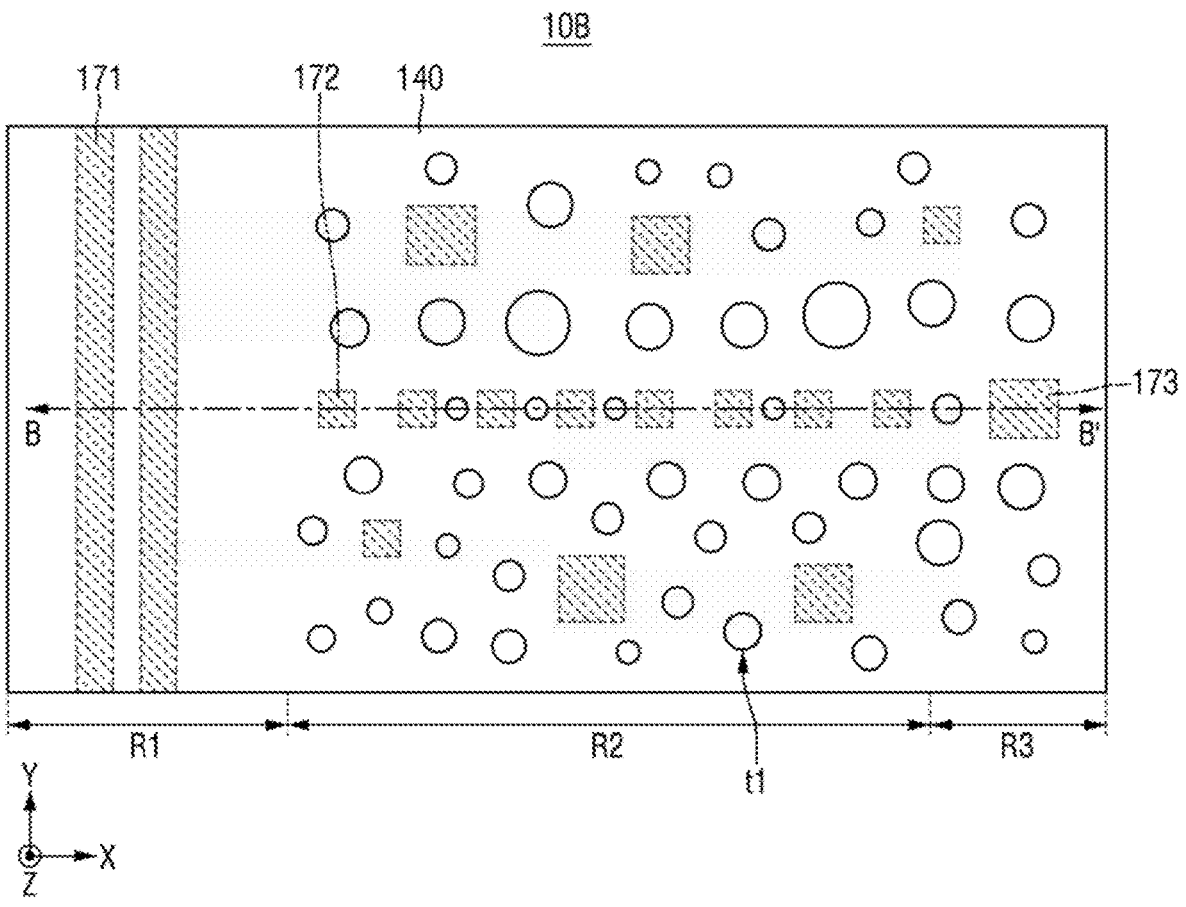
FIG. 14 is an illustrative plan view of a semiconductor memory device according to example embodiments.
Figure 15:
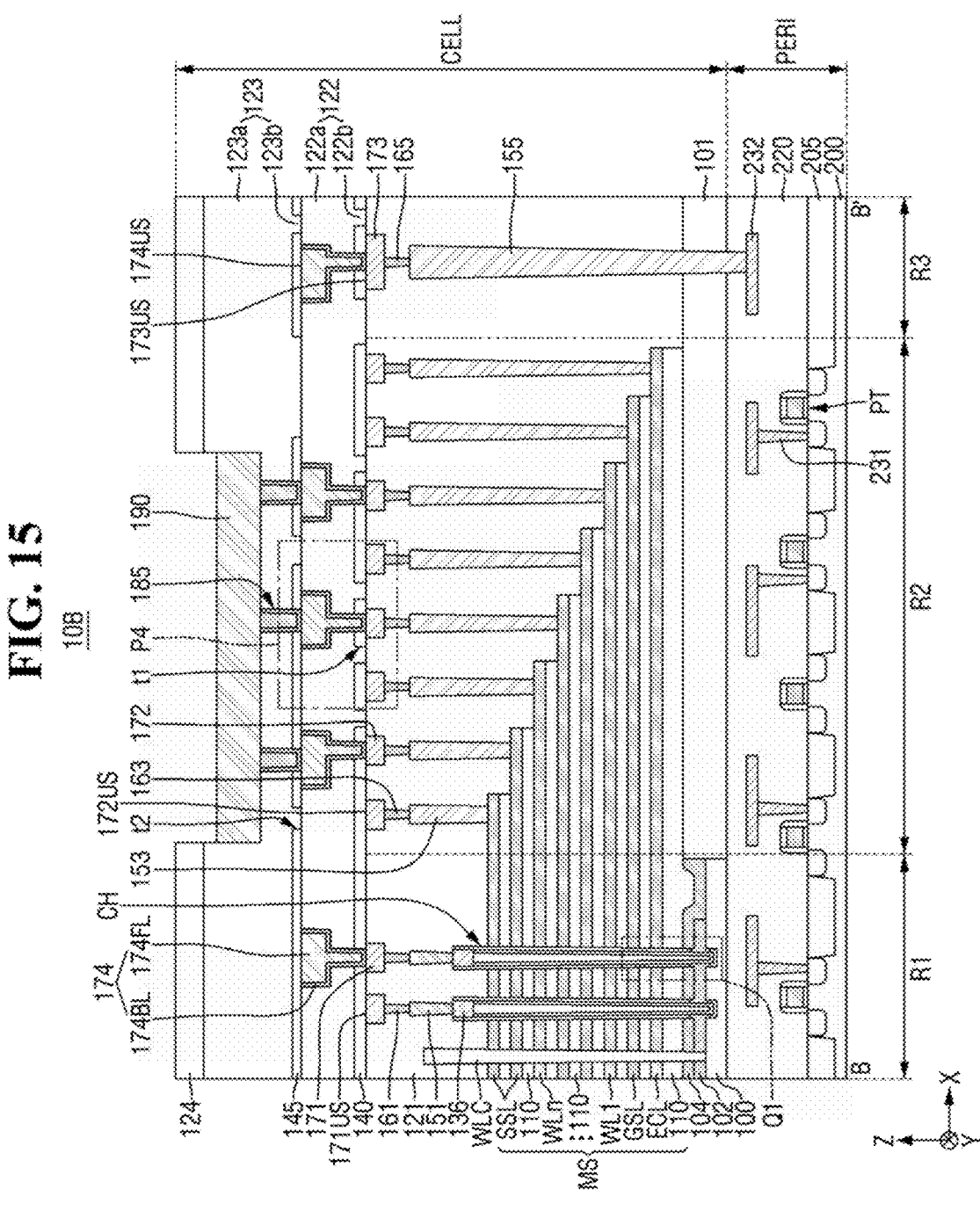
FIG. 15 is an illustrative cross-sectional view cut along a line B-B' in FIG. 14.
Figure 16:
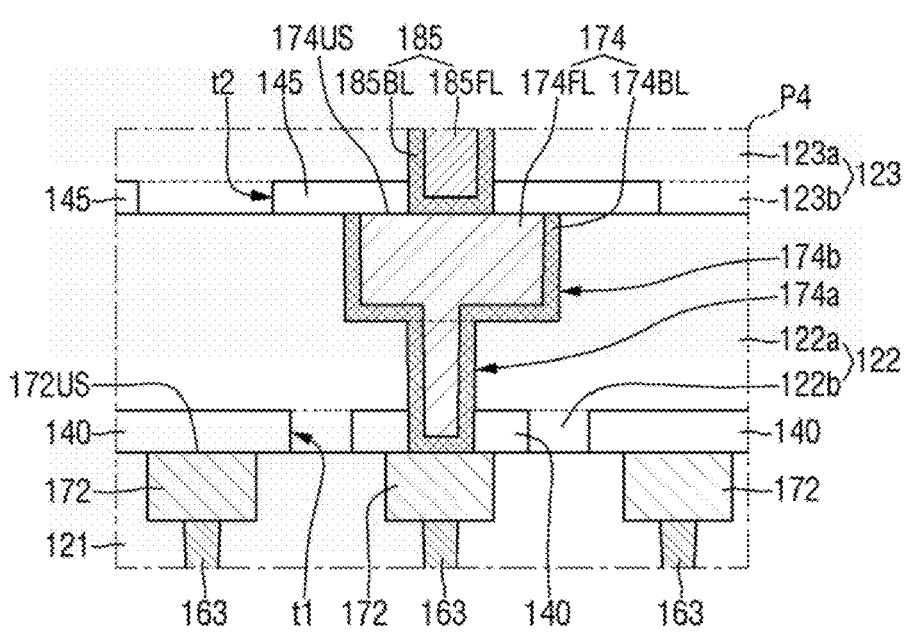
FIG. 16 is an enlarged view of a P4 area in FIG. 14.

FIG. 14 is an illustrative plan view of a semiconductor memory device according to example embodiments. FIG. 15 is an illustrative cross-sectional view cut along a line B-B' in FIG. 14. FIG. 16 is an enlarged view of a P4 area in FIG. 14. For reference, FIG. 14 may be an illustrative plan view of the first blocking layer 140 and the first to third metal patterns 171, 172, and 173 of the semiconductor memory device according to the present disclosure.

Referring to FIG. 14 to FIG. 16, a semiconductor memory device 10B according to some still yet further embodiments of the present disclosure may include the first blocking layer 140 and a second blocking layer 145. The first blocking layer 140 may extend along the upper surfaces 171US of the plurality of first metal patterns 171, the upper surface of the first interlayer insulating film 121, the upper surfaces 172US of the plurality of second metal patterns 172, and the upper surfaces 173US of the plurality of third metal patterns 173. In some embodiments, the first blocking layer 140 may include a plurality of first trenches t1. The plurality of first trenches t1 may expose at least a portion of the first interlayer insulating film 121.

In FIG. 14, the plurality of first trenches t1 may be in the extension area R2 and the pad area R3, but may not be in the cell array area R1. Further, in a plan view, each of the first trenches t1 may have a circular shape.

Since the plurality of first trenches t1 may not be in the cell array area R1, the first blocking layer 140 may overlap an entirety of a portion of the substrate in the cell array area R1 in the third direction Z. However, the first blocking layer 140 may partially overlap a portion of the substrate in the extension area R2 and may partially overlap a portion of the substrate in the pad area R3 in the third direction Z.

An oxide-based insulating material may be in each of the plurality of first trenches t1. In an implementation, at least a portion of the second interlayer insulating film 122 may be in each of the plurality of first trenches t1. In an implementation, the second portion 122b of the second interlayer insulating film 122 may be in each of the plurality of first trenches t1. As the oxide-based insulating material may be in each of the plurality of first trenches t1, hydrogen may migrate through the plurality of first trenches t1. In an implementation, hydrogen in the second interlayer insulating film 122 may migrate to the first interlayer insulating film 121 through the plurality of first trenches t1.

The second blocking layer 145 may extend along the upper surfaces 174US of the plurality of fourth metal patterns and the upper surface of the second interlayer insulating film 122. In some embodiments, the second blocking layer 145 may include a plurality of second trenches t2. The plurality of second trenches t2 may expose at least a portion of the second interlayer insulating film 122.

The plurality of second trenches t2 may be in the extension area R2 and the pad area R3, but may not be formed in the cell array area R1. Further, in a plan view, each of the second trenches t2 may have a circular shape.

Since the plurality of second trenches t2 may not be in the cell array area R1, the second blocking layer 145 may overlap an entirety of a portion of the substrate in the cell array area R1 in the third direction Z. However, the second blocking layer 145 may partially overlap a portion of the substrate in the extension area R2 and may partially overlap a portion of the substrate in the pad area R3 in the third direction Z.

An oxide-based insulating material may be in each of the plurality of second trenches t2. In an implementation, at least a portion of the third interlayer insulating film 123 may be in each of the plurality of second trenches t2. In an implementation, the second portion 123b of the third interlayer insulating film 123 may be in each of the plurality of second trenches t2. As the oxide-based insulating material may be in each of the plurality of second trenches t2, hydrogen may migrate through the plurality of second trenches t2. In an implementation, hydrogen in the third interlayer insulating film 123 may migrate to the second interlayer insulating film 122 through the plurality of second trenches t2.

In some embodiments, each of the plurality of first trenches t1 may not overlap the plurality of first metal patterns 171, the plurality of second metal patterns 172, and the plurality of third metal patterns 173 in the third direction Z. Further, each of the plurality of second trenches t2 may not overlap the plurality of metal layers 174 in the third direction Z. In other words, the first blocking layer 140 entirely covers the upper surfaces 171US of the plurality of first metal patterns 171, the upper surfaces 172US of the plurality of second metal patterns 172, and the upper surfaces 173US of the plurality of third metal patterns 173. The second blocking layer 145 entirely covers the upper surfaces 174US of the plurality of metal layers 174.

In FIG. 15, each of at least some of the plurality of first trenches t1 may partially overlap with each of at least some of the plurality of second trenches t2 in the third direction Z. The plurality of first trenches t1 may not overlap the plurality of second trenches t2 in the third direction Z.

In some embodiments, the first blocking layer 140 entirely covers the upper surfaces 172US of the plurality of second metal patterns 172. At least a portion of the first blocking layer 140 does not overlap with each of the upper surfaces 172US of the plurality of second metal patterns 172 in the third direction Z. Accordingly, a width of the first trench t1 may be smaller than a spacing between adjacent ones of the second metal patterns 172.

Similarly, the second blocking layer 145 entirely covers the upper surfaces 174US of the fourth metal patterns 174b. At least a portion of the second blocking layer 145 does not overlap with each of the upper surfaces 174US of the plurality of fourth metal patterns 174b in the third direction Z. Accordingly, a width of the second trench t2 may be smaller than a spacing between adjacent ones of the fourth metal patterns 174b.

Figure 17:
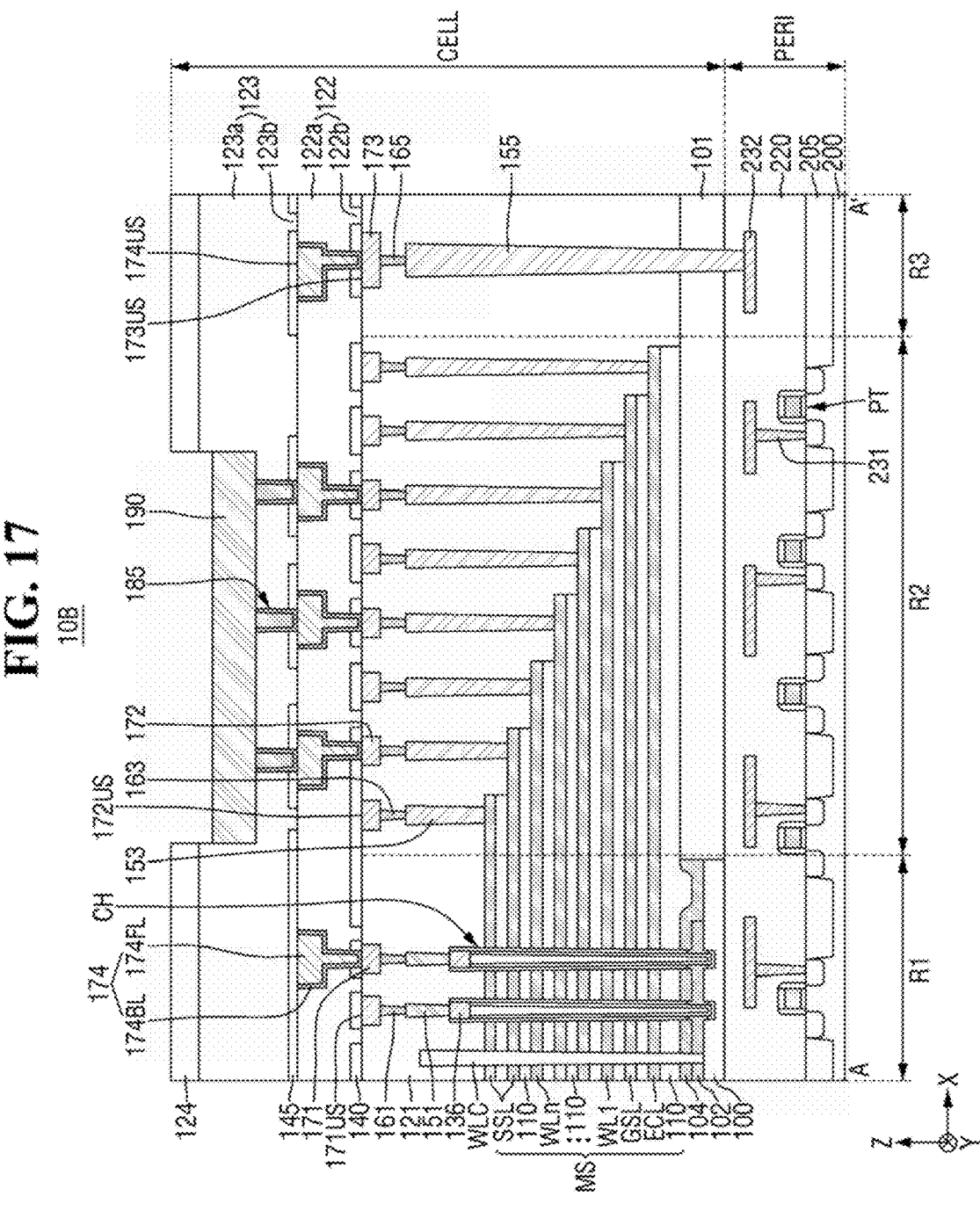
FIG. 17 is a diagram of a semiconductor memory device according to example embodiments.

FIG. 17 is a diagram of a semiconductor memory device according to example embodiments. For convenience of description, the following descriptions are based on differences thereof from those as set forth above with reference to FIG. 14 to FIG. 16.

Referring to FIG. 17, in the semiconductor memory device 10B according to example embodiments, at least some of the plurality of first trenches t1 may be on the substrate and in the cell array area R1. In an implementation, at least a portion of the first blocking layer 140 does not overlap with a portion of the substrate in the cell array area R1 in the third direction Z. At least some of the plurality of second trenches t2 may be on the substrate and in the cell array area R1. In this case, at least a portion of the second blocking layer 145 does not overlap with a portion of the substrate in the cell array area R1 in the third direction Z.

Figure 18A:
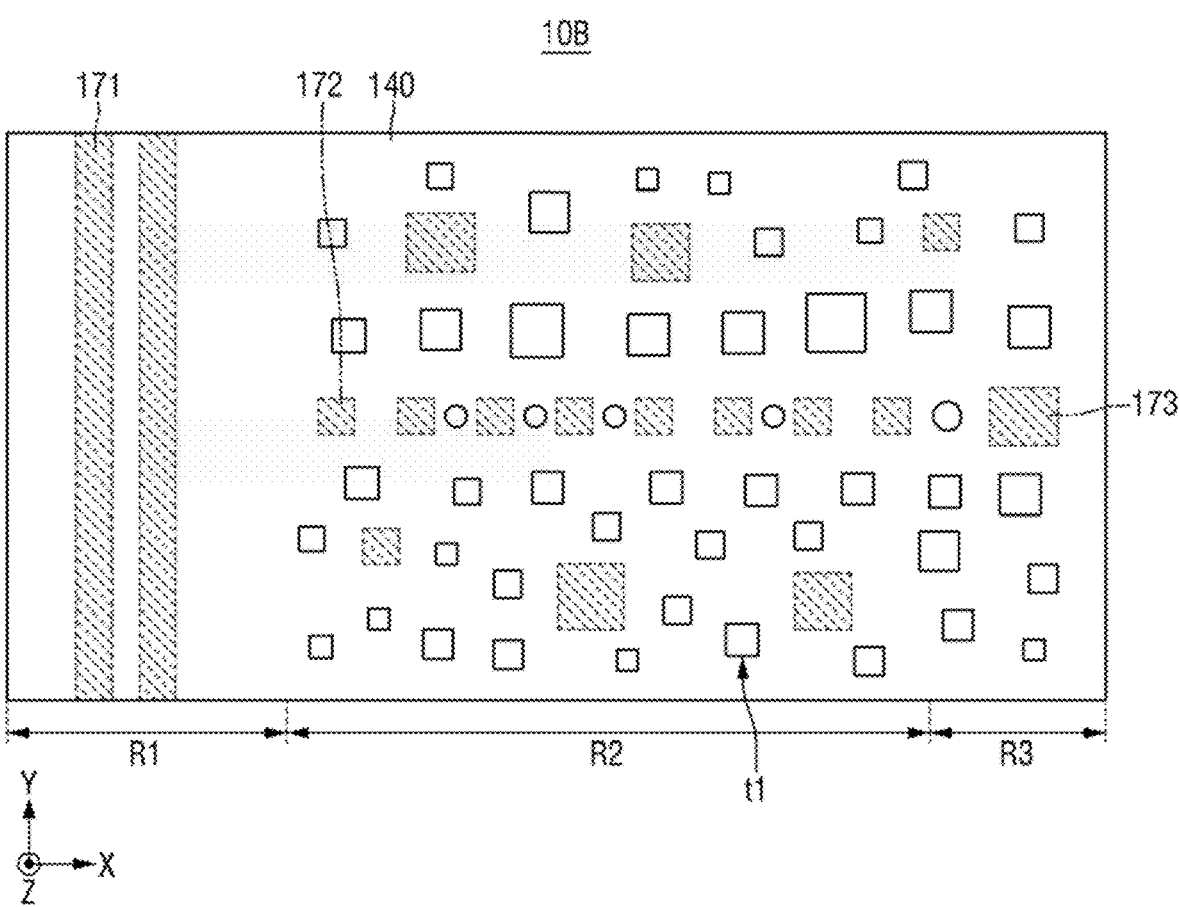
FIG. 18A to FIG. 18C are diagrams of a semiconductor memory device according to example embodiments.
Figure 18B:
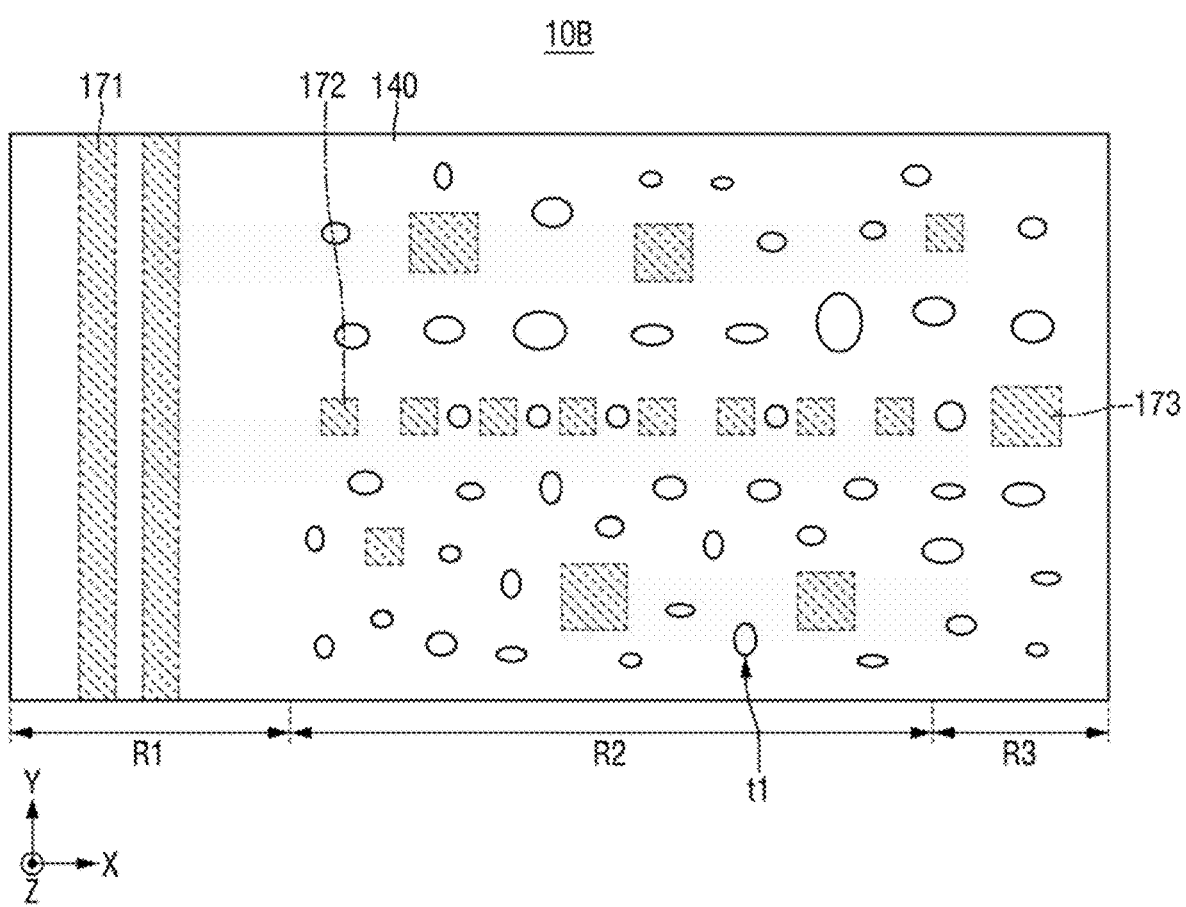
Figure 18C:
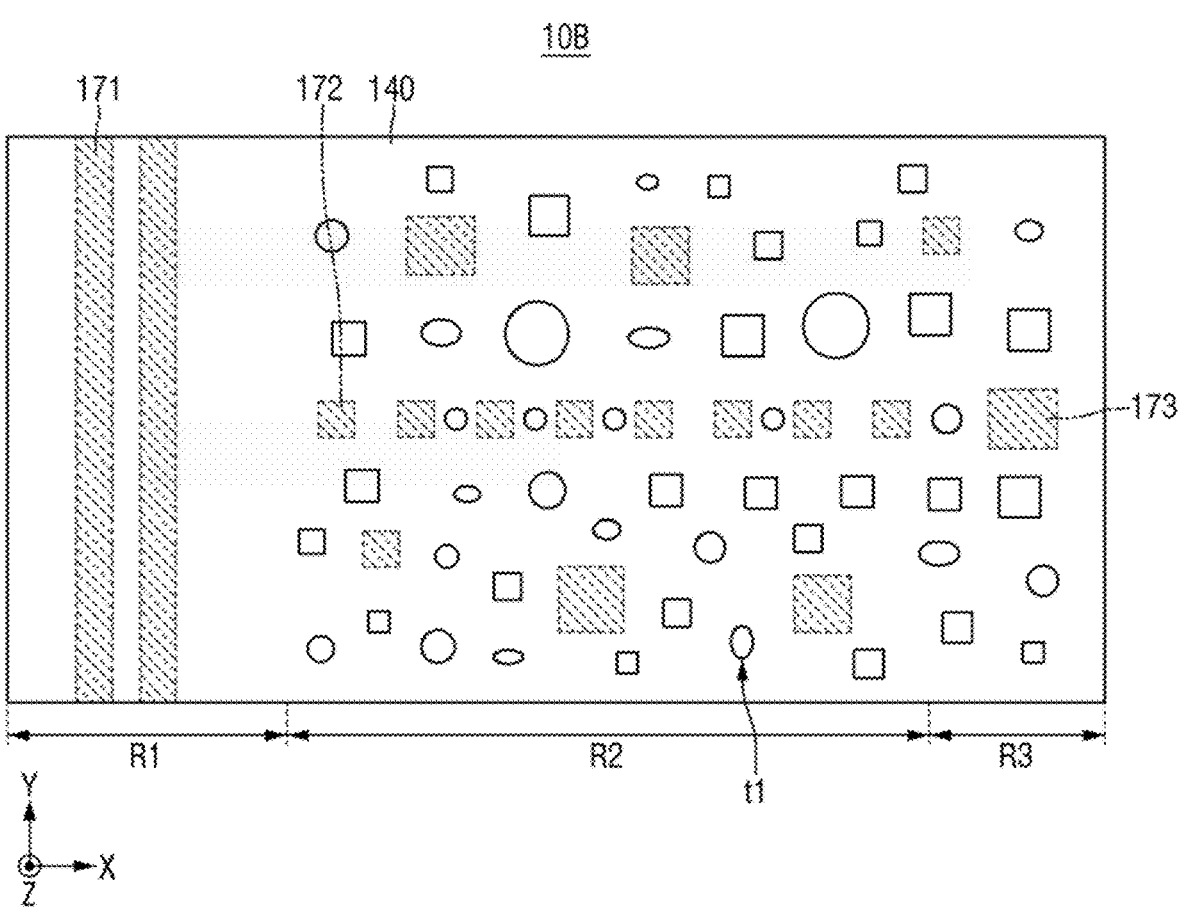

FIG. 18A to FIG. 18C are diagrams of a semiconductor memory device according to example embodiments. For convenience of description, the following descriptions are based on differences thereof from those as set forth above with reference to FIG. 14 to FIG. 16.

First, referring to FIGS. 18A and 18B, in the semiconductor memory device 10B according to example embodiments, a shape of the first trench t1 in a plan view may be a rectangular shape or an elliptical shape. In FIG. 18A, the shape of the first trench t1 in the plan view may be the rectangular shape. In the plan view in FIG. 18B, the shape of the first trench t1 may be the elliptical shape.

In FIG. 18C, the shapes of the first trenches t1 in the plan view may include a combination of a circular shape, a rectangular shape, and an elliptical shape. To clarify, a shape in a plan view of each of the plurality of first trenches t1 may include a circle, a rectangle, or an ellipse. In an implementation, in the plan view, the first trench t1 may have various shapes. In the plan view, the shape of the first trench t1 may be changed according to a product design. Hereinafter, a method for manufacturing a semiconductor memory device according to some embodiments of the present disclosure is described.

Figure 19:
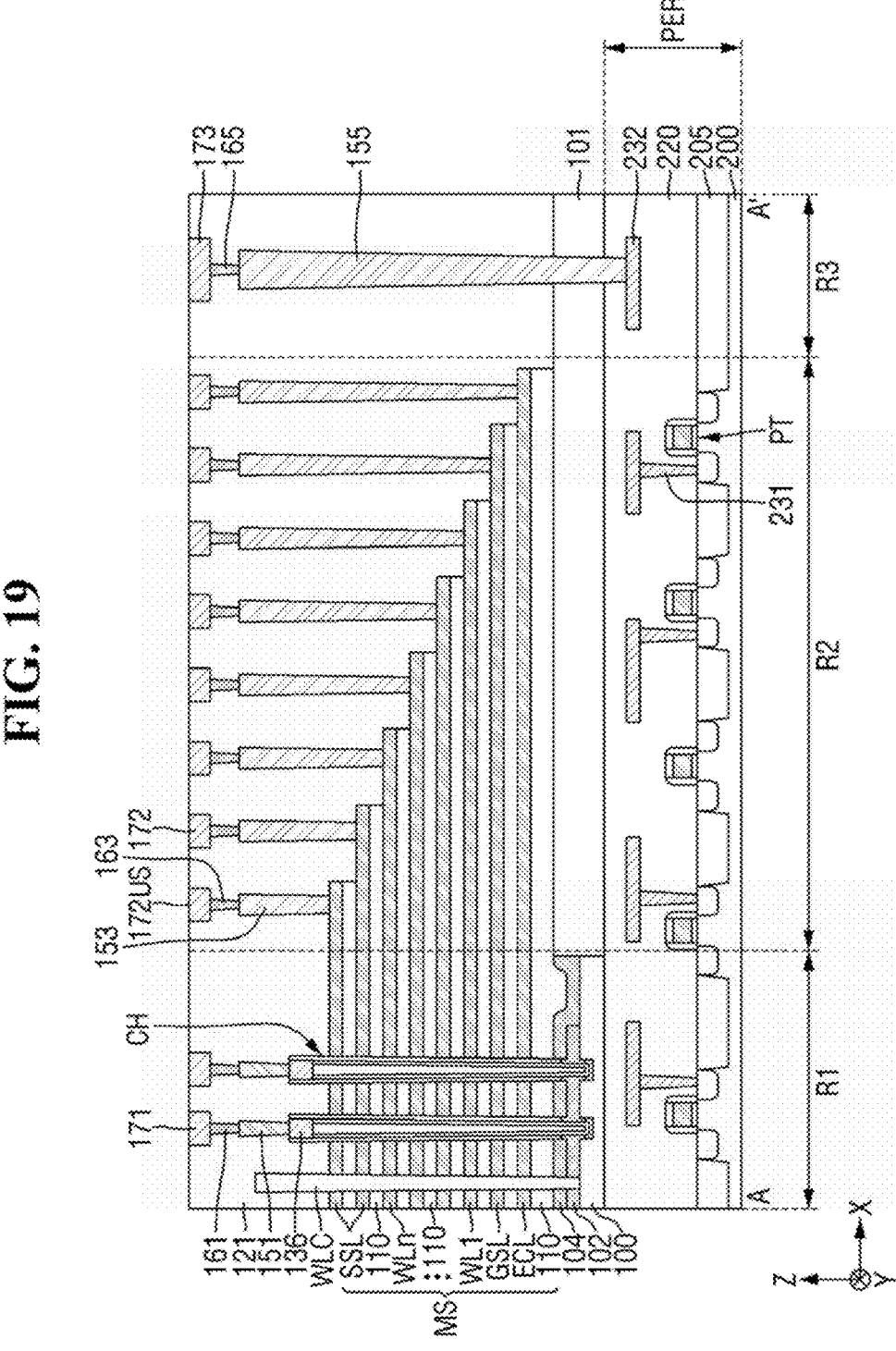

FIG. 19 to FIG. 31 are diagrams sequentially showing a process of manufacturing the semiconductor memory device having the cross section of FIG. 4. First, referring to FIG. 19, the peripheral circuit substrate 200, the peripheral circuit element PT, and the inter-wiring insulating film 220 may be disposed. The cell substrate 100 and the insulating pattern 101 may be on the inter-wiring insulating film 220.

The mold structure MS may be on the cell substrate 100 and the insulating pattern 101. The mold structure MS may include the plurality of gate electrodes ECL, GSL, WL1 to WLn, and SSL, and the plurality of mold insulating films 110 that may be alternately stacked on top of each other while being on the cell substrate 100. Each of the gate electrodes ECL, GSL, WL1 to WLn, and SSL and each of the mold insulating films 110 may have a layered structure extending in a parallel manner with the upper surface of the cell substrate 100. The gate electrodes ECL, GSL, WL1 to WLn, and SSL may be sequentially stacked on the cell substrate 100 while being spaced apart from each other via each of the mold insulating films 110.

Subsequently, the plurality of channel structures CH may extend through the mold structure MS and so as to intersect the plurality of gate electrodes ECL, GSL, WL1 to WLn, and SSL. Further, the word-line cutting structure WLC extending through the mold structure MS may be formed. Subsequently, the first interlayer insulating film 121 may be on the mold structure MS.

The plurality of cell contacts 153 extending through the first interlayer insulating film 121 connected to some of the gate electrodes ECL, GSL, WL1 to WLn, and SSL may be formed. Further, the through-contact 155 extending through the first interlayer insulating film 121 connected to the peripheral circuit element PT may be formed.

Subsequently, the plurality of first metal patterns 171, the plurality of second metal patterns 172, and the plurality of third metal patterns 173 may be formed. The upper surface 171US of each of the plurality of first metal patterns 171, the upper surface 172US of each of the plurality of second metal patterns 172, and the upper surface 173US of each of the plurality of third metal patterns 173 may be coplanar with each other. Each of the plurality of first metal patterns 171 may be connected to each channel structure CH via the first and second bit-line contacts 151 and 161. The plurality of second metal patterns 172 may be respectively connected to the plurality of cell contacts 153 via the first via contacts 163. Some of the plurality of third metal patterns 173 may be connected to the through-contact 155 via the second via contact 165.

Figure 20:
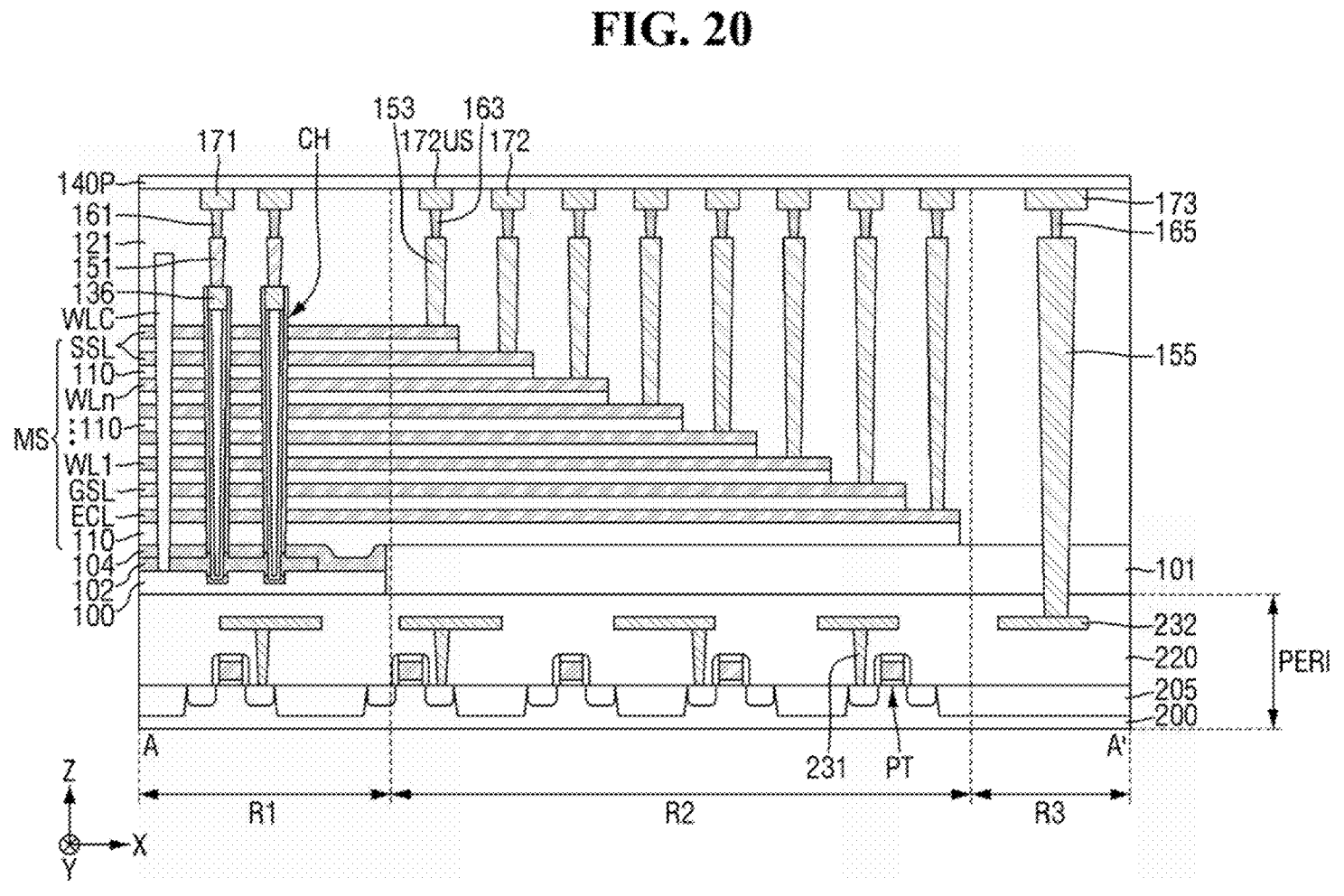

Referring to FIG. 20, a first pre-blocking pattern 140P may be along the upper surfaces 171US of the plurality of first metal patterns 171, the upper surfaces 172US of the plurality of second metal patterns 172, the upper surfaces 173US of the plurality of third metal patterns 173, and the upper surface of the first interlayer insulating film 121. The first pre-blocking pattern 140P may include a nitride-based insulating material. In an implementation, the first pre-blocking pattern 140P may be embodied as a silicon nitride layer.

Figure 21:
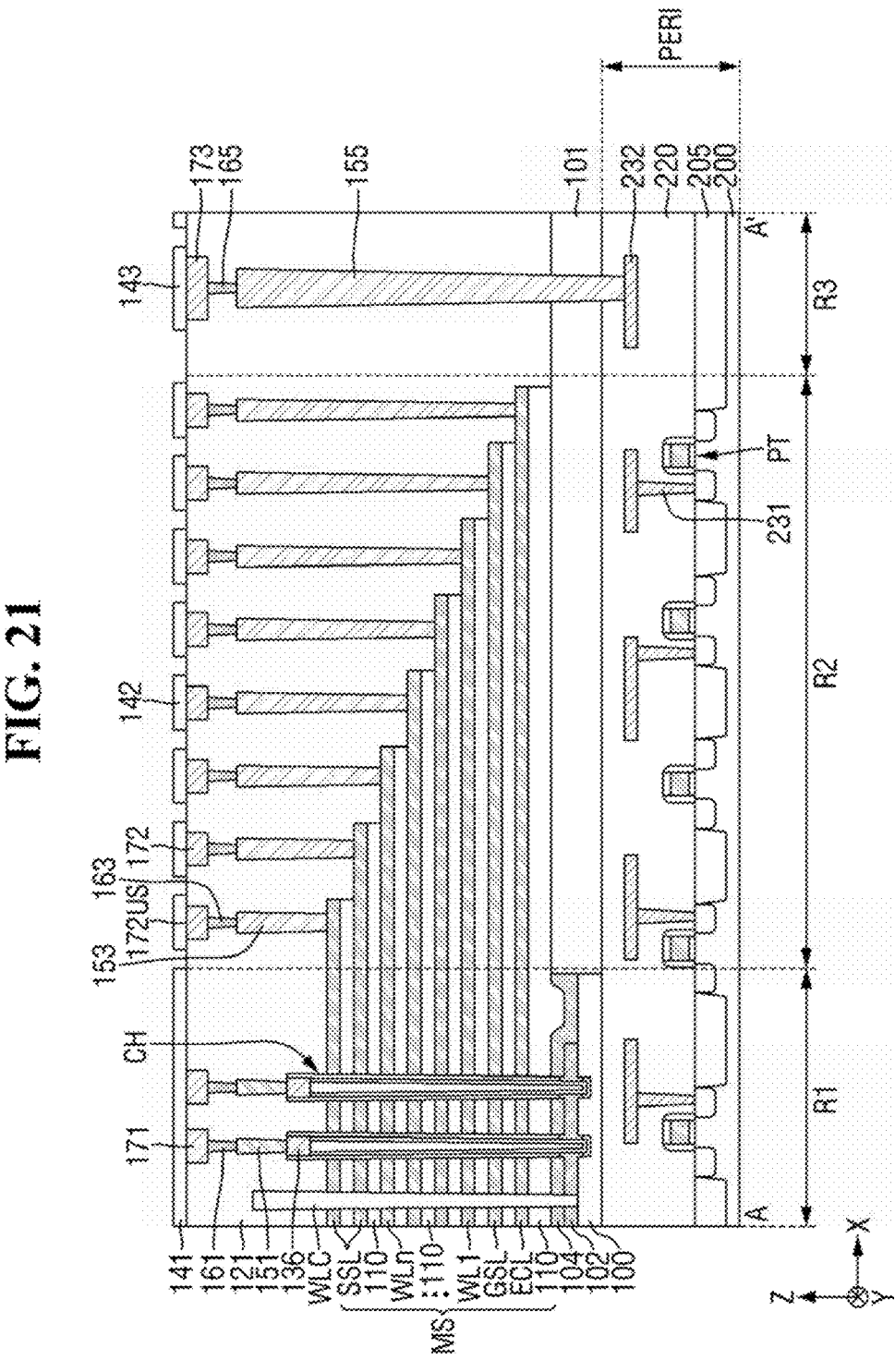

Referring to FIG. 21, the first blocking pattern 141, the plurality of second blocking patterns 142, and at least one or more third blocking patterns 143 may be formed by removing at least a portion of the first pre-blocking pattern 140P. The at least a portion of the first pre-blocking pattern 140P may be removed using a wet etching process and/or a dry etching process. The at least a portion of the first pre-blocking pattern 140P may be removed to expose at least a portion of the first interlayer insulating film 121.

The first blocking pattern 141 entirely covers the upper surface 171US of each of the plurality of first metal patterns 171. Each of the plurality of second blocking patterns 142 entirely covers the upper surface 172US of each of the plurality of second metal patterns 172 corresponding thereto. The at least one third blocking pattern 143 may entirely cover the upper surface 173US of each of the plurality of third metal patterns 173 corresponding thereto.

Figure 22:
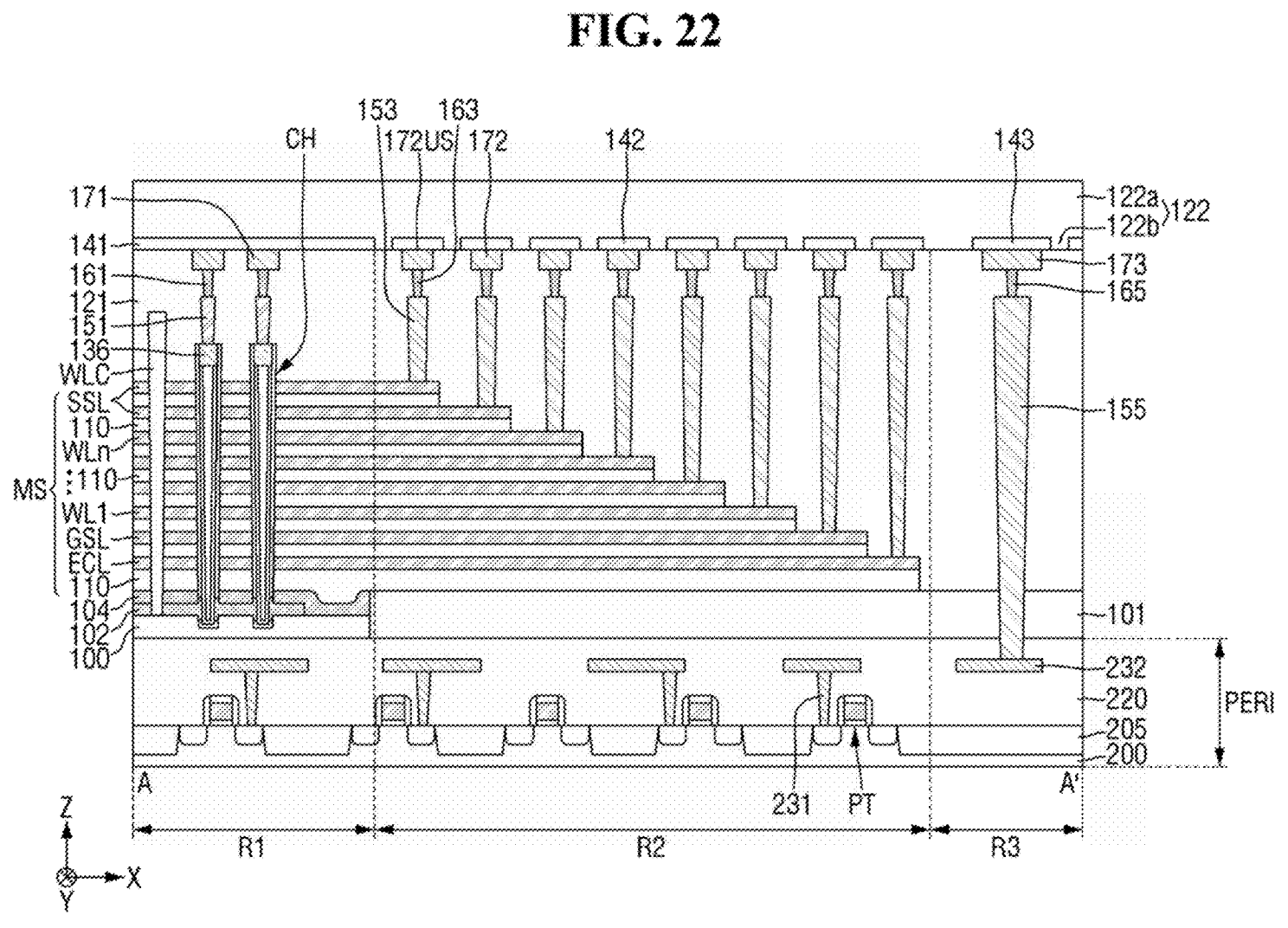

Referring to FIG. 22, the second interlayer insulating film 122 may be on the first interlayer insulating film 121. The second interlayer insulating film 122 may include the first portion 122a and the second portion 122b. The second portion 122b of the second interlayer insulating film 122 may be between the first blocking pattern 141 and the second blocking pattern 142, between adjacent ones of the plurality of second blocking patterns 142, between the second blocking pattern and the third blocking pattern 143, and between adjacent ones of the plurality of between third blocking patterns 143. The first portion 122a of the second interlayer insulating film 122 may be on the first blocking pattern 141, the plurality of second blocking patterns 142, and the plurality of third blocking patterns 143.

Figure 23:
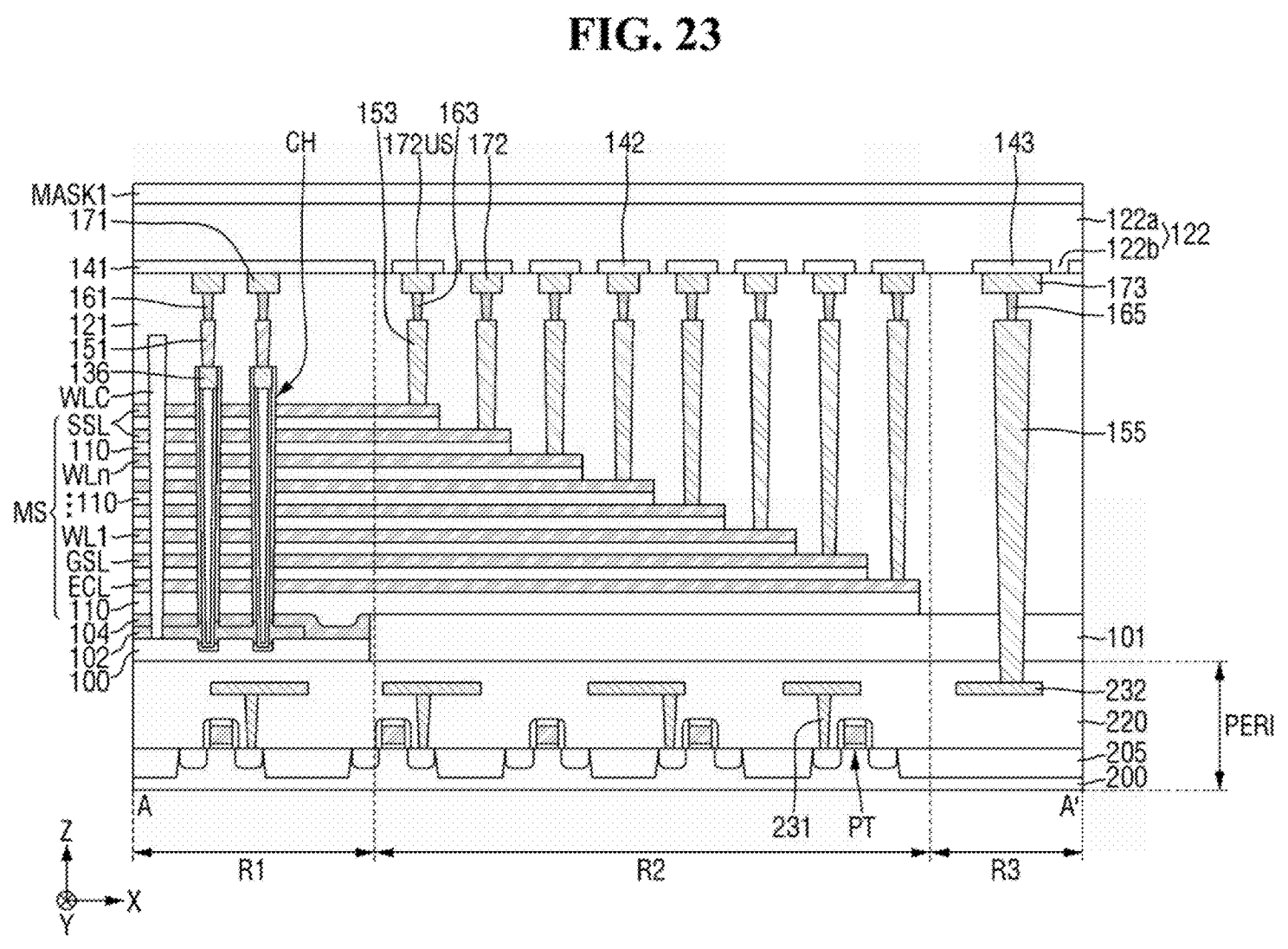

Referring to FIG. 23, a first mask layer MASK1 may be along the upper surface of the second interlayer insulating film 122. The first mask film MASK1 may be embodied as, e.g., a silicon oxynitride (SiON) film.

Figure 24:
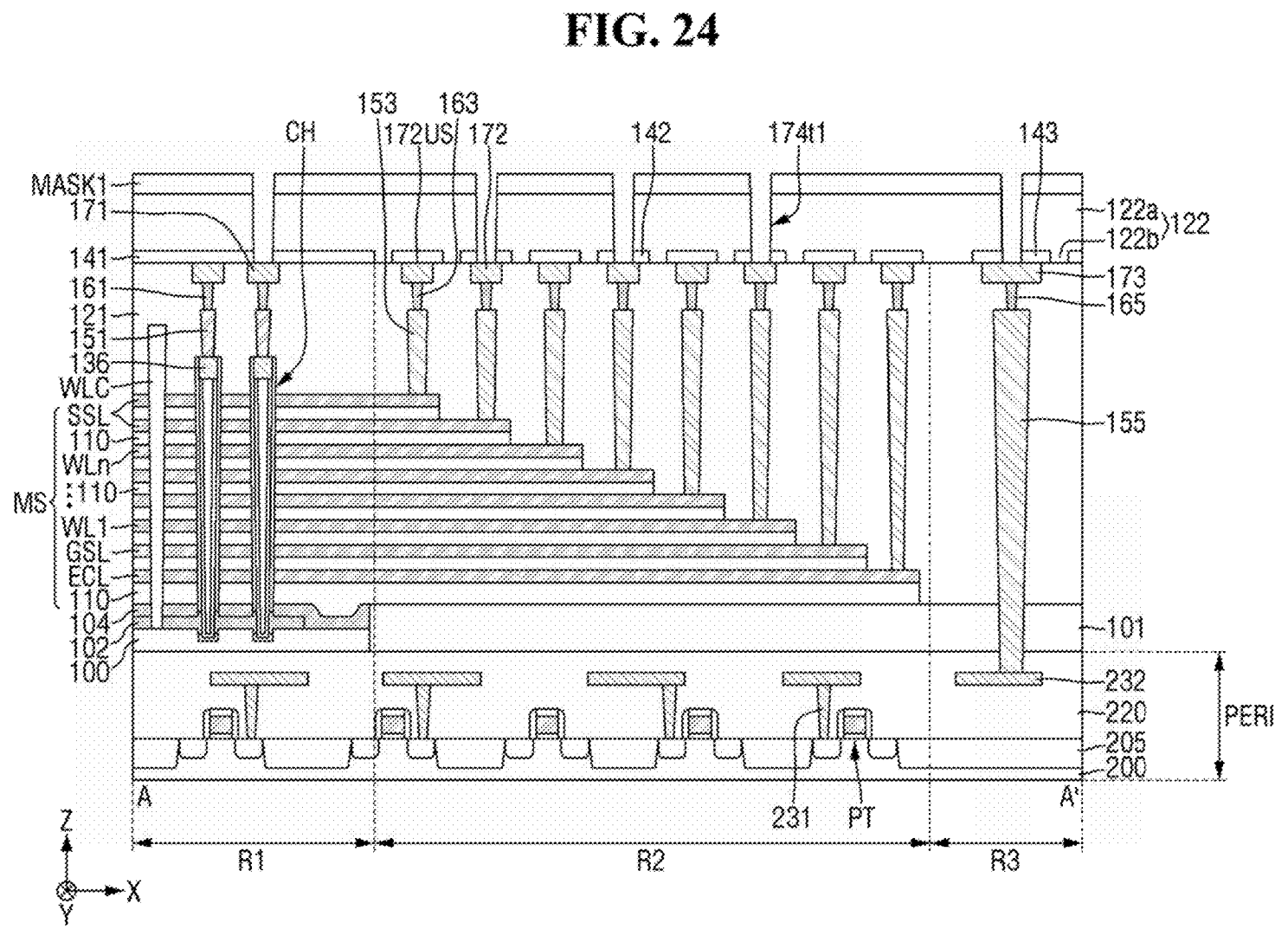

Referring to FIG. 24, a first metal trench 174*t*1 may be formed. A portion of the first mask film MASK1, a portion of the second interlayer insulating film 122, a portion of the first blocking pattern 141, a portion of the second blocking pattern 142, and a portion of the third blocking pattern 143 may be removed to form the first metal trench 174*t*1. The first metal trench 174*t*1 may expose some of the plurality of first metal patterns 171, some of the plurality of second metal patterns 172, and some of the plurality of third metal patterns 173.

Figure 25:
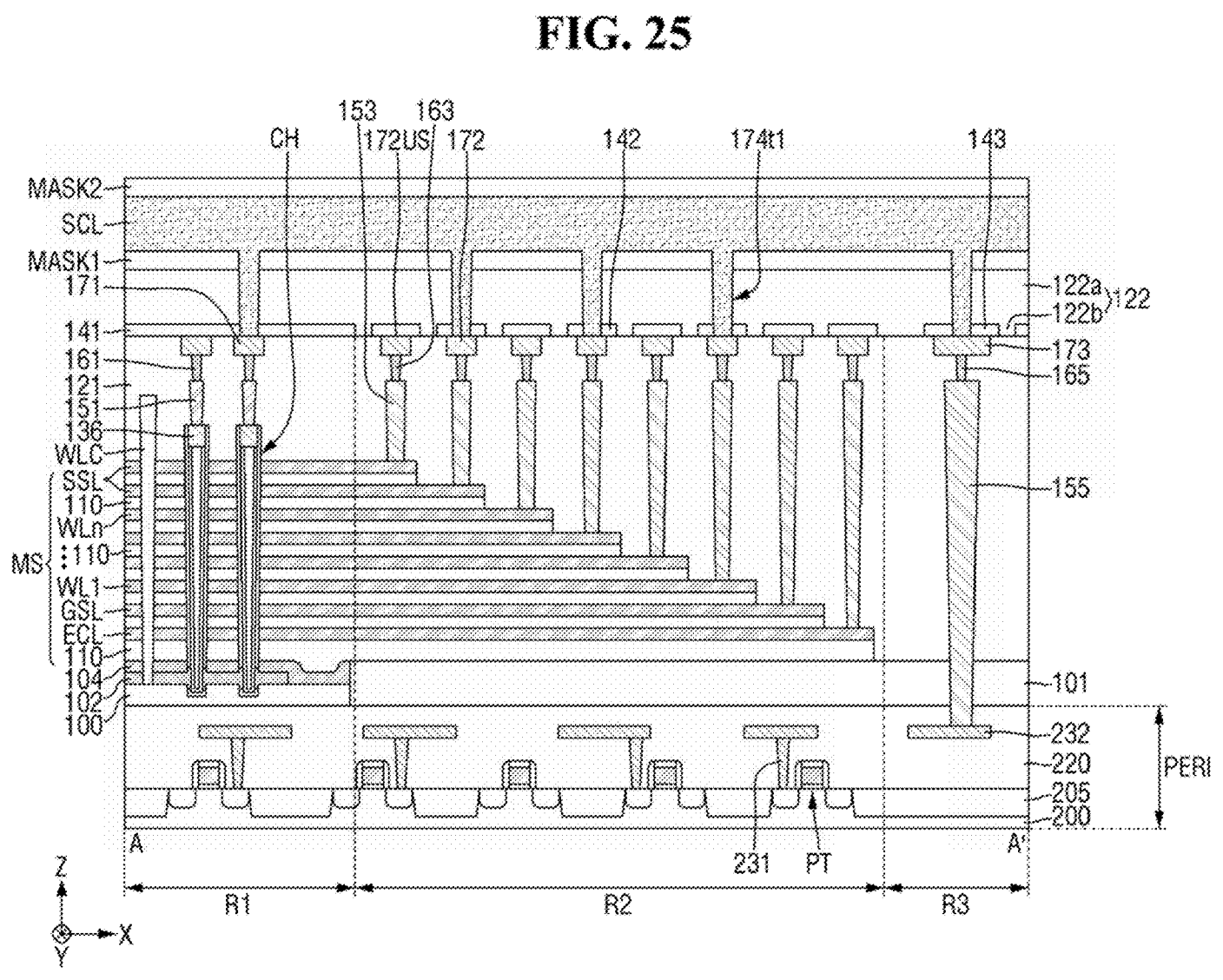

Referring to FIG. 25, a sacrificial film SCL filling the first metal trench 174*t*1 and extending along a upper surface of the first mask layer MASK1 may be formed. In an implementation, the sacrificial film SCL may be embodied as a SOH (spin on hardmask).

Subsequently, a second mask film MASK2 may be formed on the sacrificial film SCL. The second mask film MASK2 may be embodied as, e.g., a silicon oxynitride (SiON) film.

Figure 26:
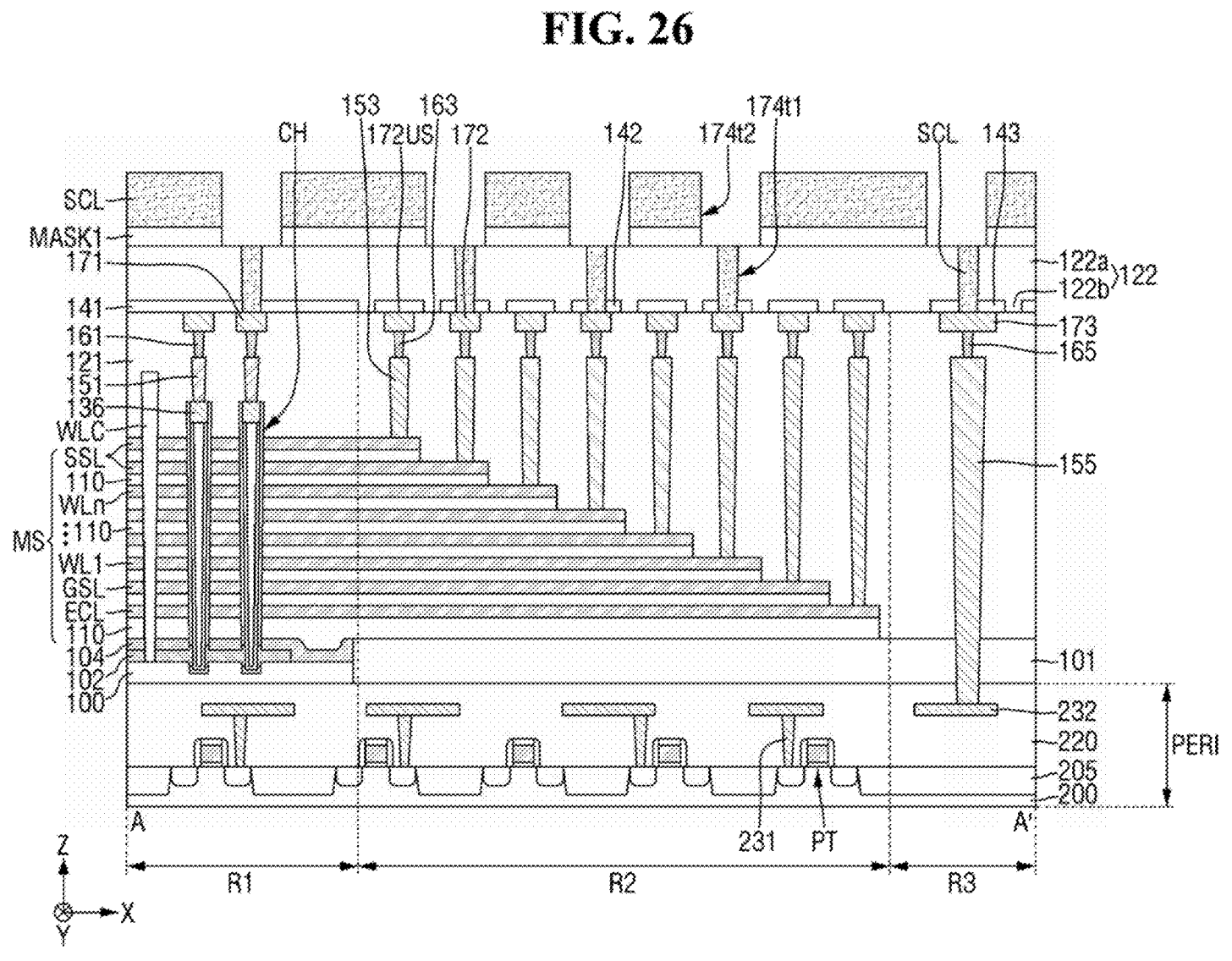

Referring to FIG. 26, a second metal trench 174*t*2 may be formed. A portion of the sacrificial film SCL and a portion of the first mask layer MASK1 may be removed to form the second metal trench 174*t*2. A width of the second metal trench 174*t*2 may be greater than that of the first metal trench 174*t*1. In this regard, a portion of the sacrificial film SCL may be in the first metal trench 174*t*1.

Figure 27:
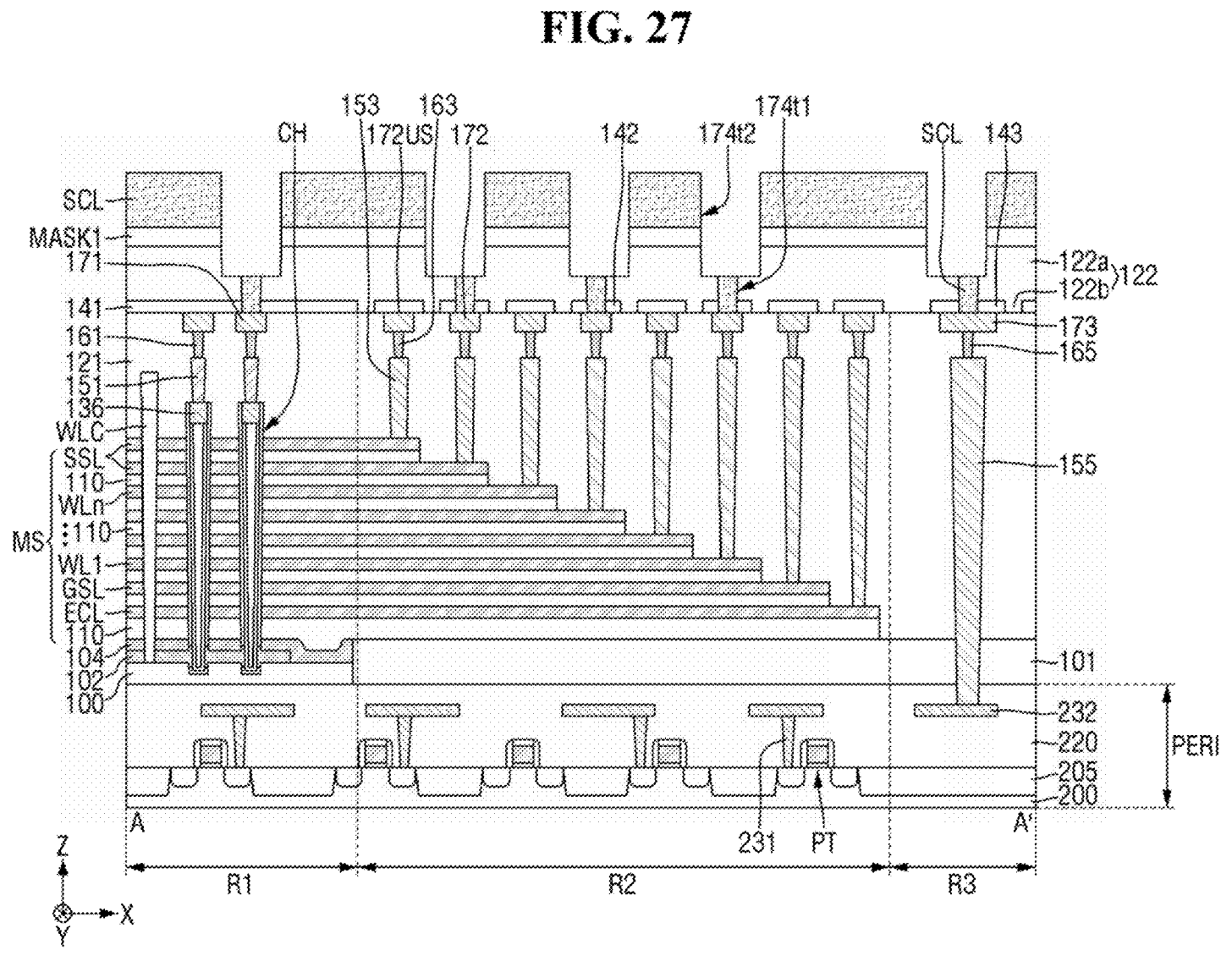

Referring to FIG. 27, the second metal trench 174*t*2 may further extend. In an implementation, at least a portion of the second metal trench 174*t*2 may be in the second interlayer insulating film 122. A portion of the second metal trench 174*t*2 defined in the second interlayer insulating film 122 may have a shape of a fourth metal pattern to be described later. The first metal trench 174*t*1 may have a shape of a via which will be described later.

Figure 28:
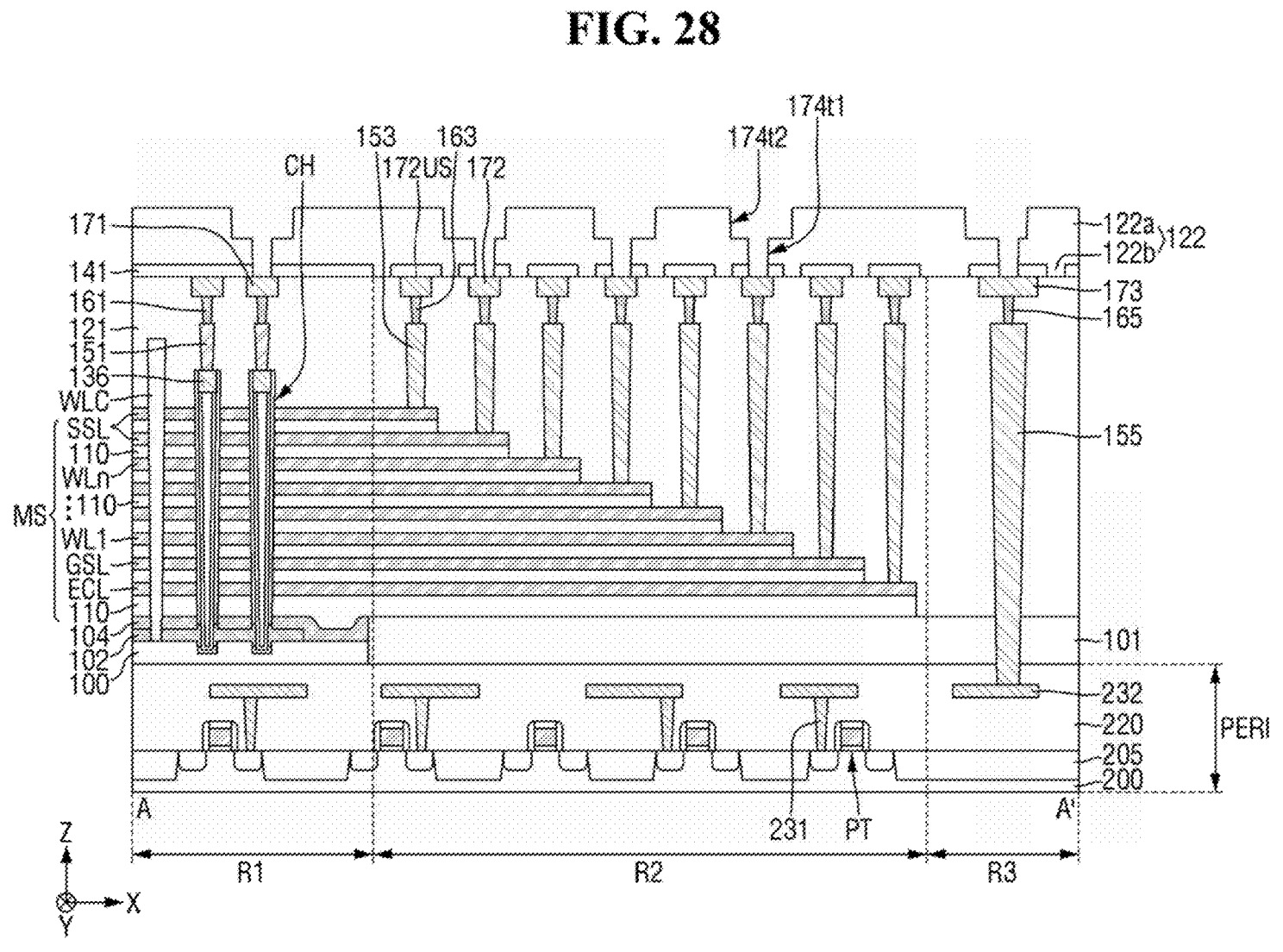

Referring to FIG. 28, the sacrificial film SCL and the first mask film MASK1 may be removed. Accordingly, the upper surface 171US of each of the plurality of first metal patterns 171, the upper surface 172US of each of the plurality of second metal patterns 172, and the upper surface 173US of each of the plurality of third metal patterns 173 may be exposed again. Further, the upper surface of the second interlayer insulating film 122 may be exposed.

Figure 29:
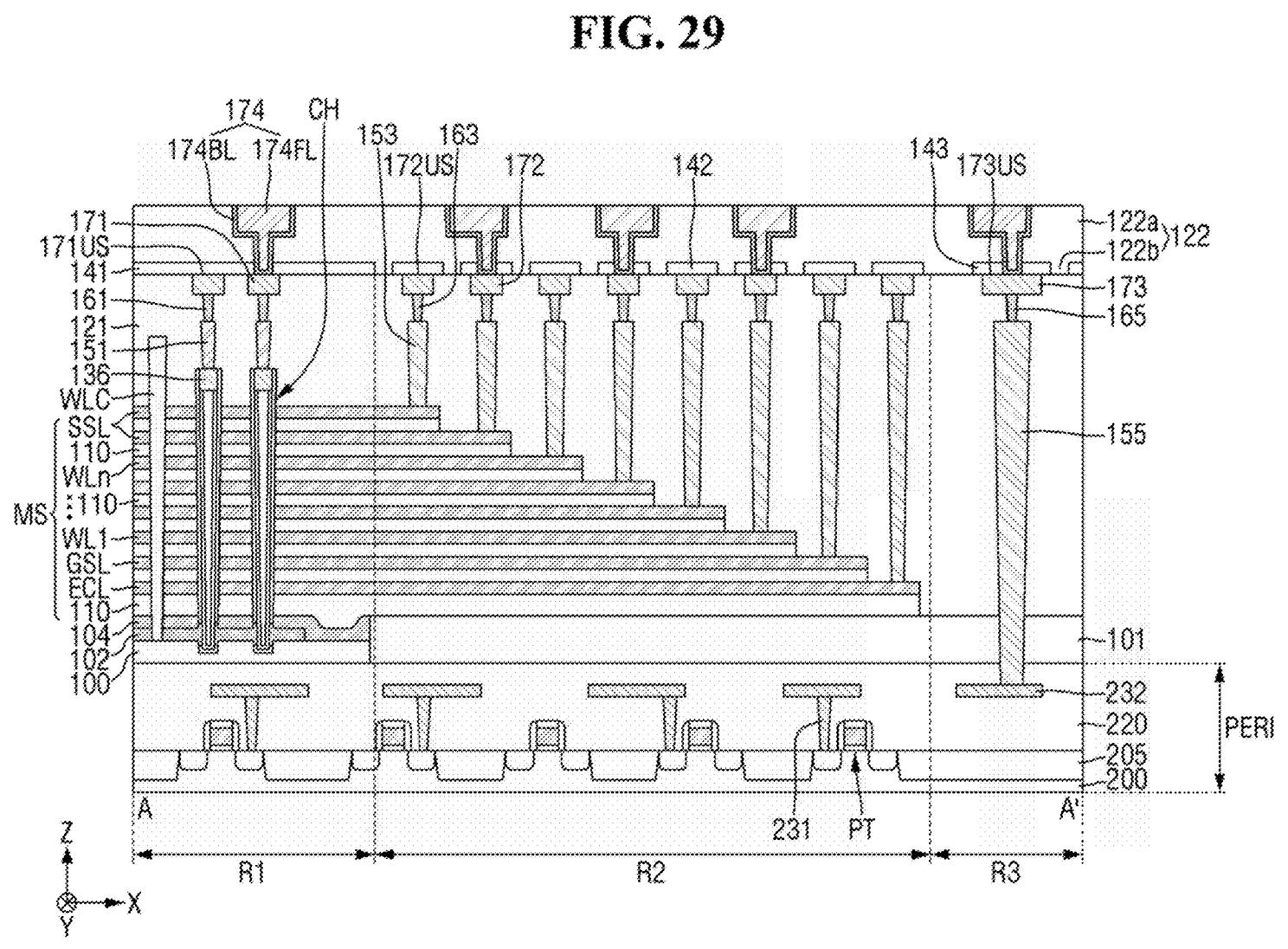

Referring to FIG. 29, the metal layer 174 may be formed. The metal layer 174 may fill the first and second metal trenches 174*t*1 and 174*t*2. The metal layer 174 may be formed as a stack of multiple films. In an implementation, the metal layer 174 may include a barrier film and a filling film. The barrier film may be along a sidewall and a bottom surface of each of the first and second metal trenches 174*t*1 and 174*t*2. The filling film may fill a remaining portion each of the first and second metal trenches 174*t*1 and 174*t*2 after the barrier film has been formed therein. The metal layer 174 may be connected to the plurality of first metal patterns 171, the plurality of second metal patterns 172, and the plurality of third metal patterns 173.

Figure 30:
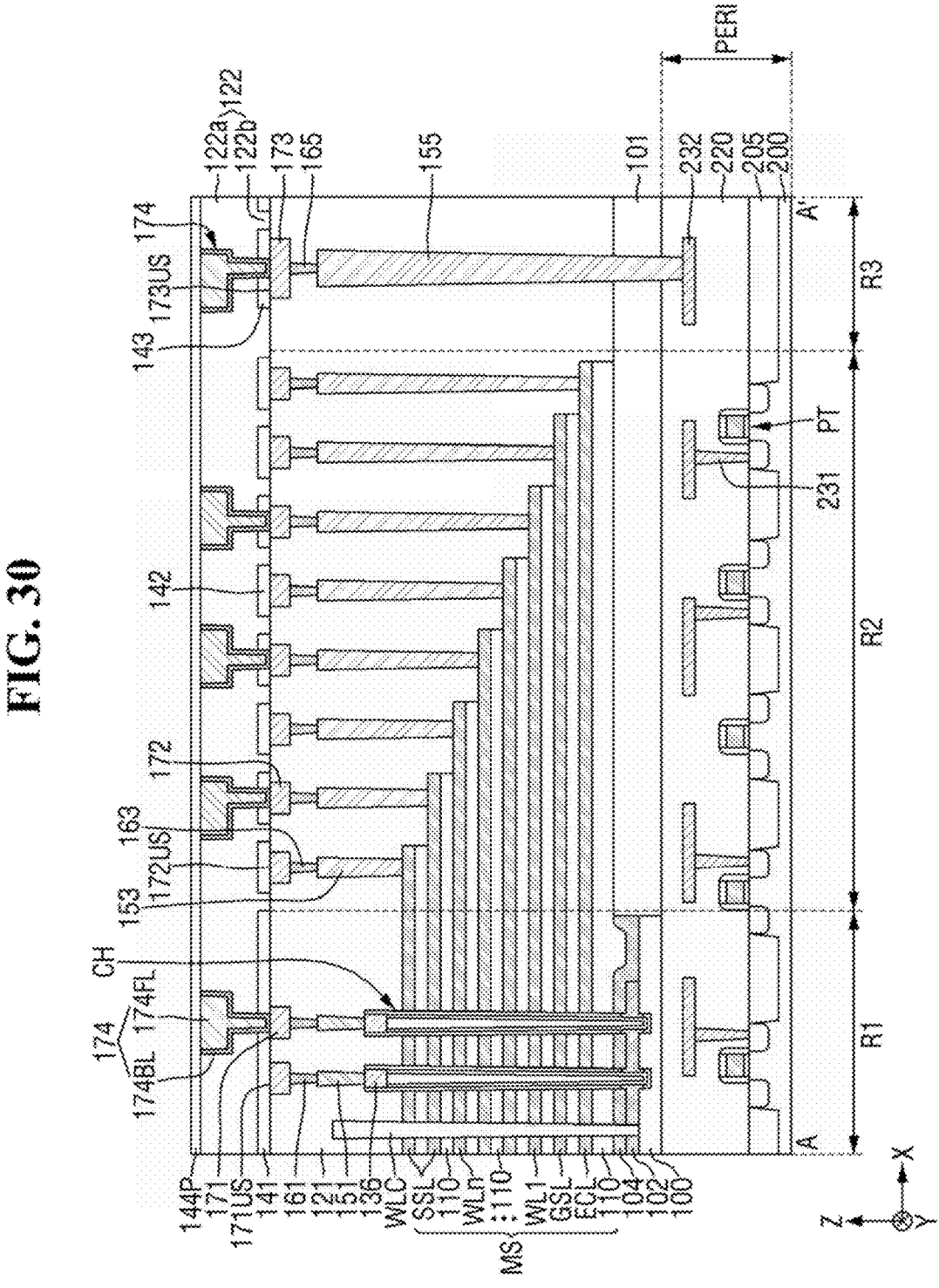

Referring to FIG. 30, a second pre-blocking pattern 144P may be formed along a upper surface of the metal layer 174 and a upper surface of the second interlayer insulating film 122. The second pre-blocking pattern 144P may include a nitride-based insulating material. In an implementation, the second pre-blocking pattern 144P may be embodied as a silicon nitride layer.

Figure 31:
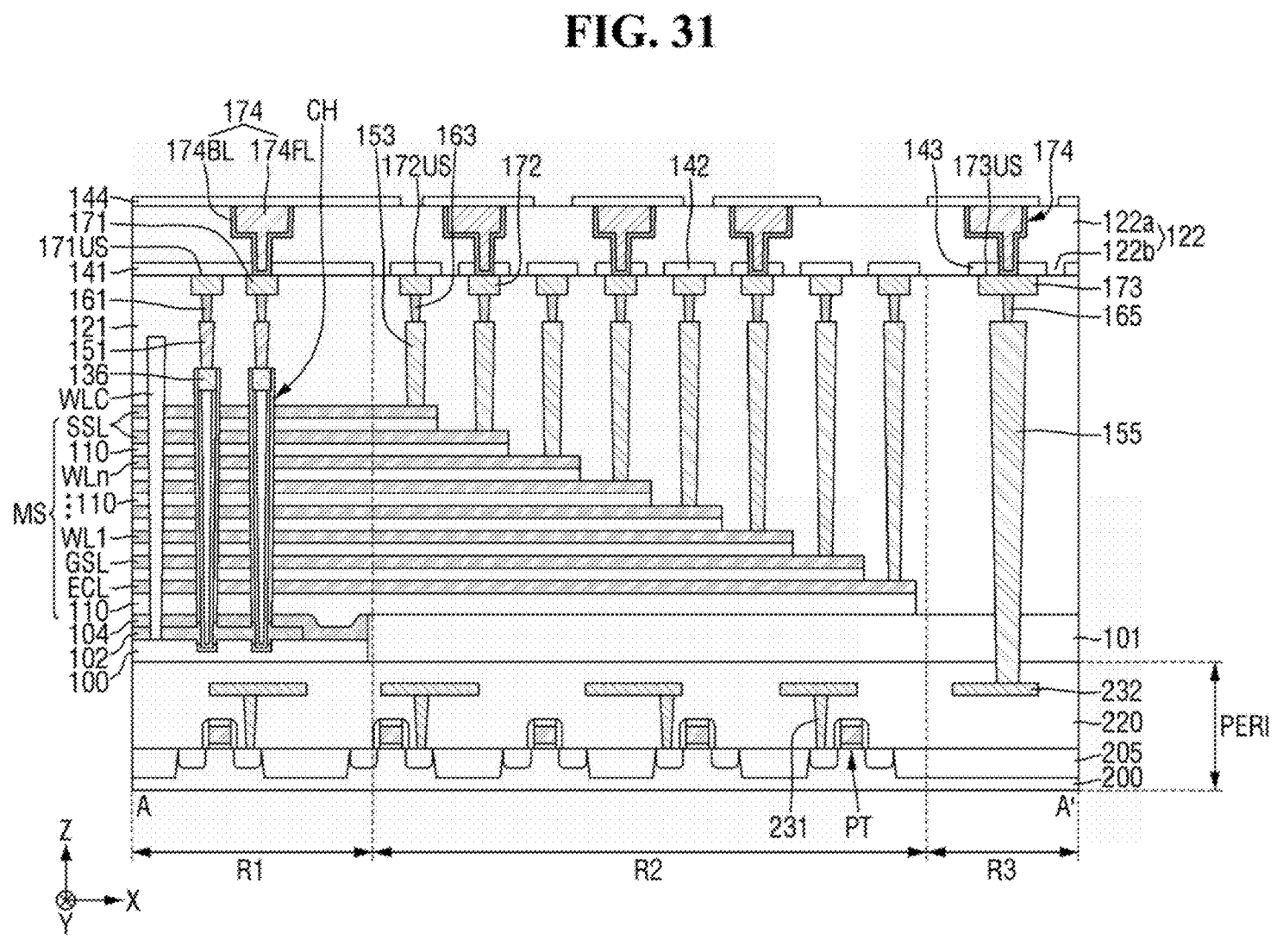

Referring to FIG. 31, the fourth blocking pattern 144 may be formed by removing at least a portion of the second pre-blocking pattern 144P. The at least a portion of the second pre-blocking pattern 144P may be removed using a wet etching process and/or a dry etching process. The at least a portion of the second pre-blocking pattern 144P may be removed to expose at least a portion of the second interlayer insulating film 122. Hereinafter, an electronic system including a semiconductor memory device according to illustrative embodiments will be described with reference to FIG. 1 to FIG. 6, and FIG. 32 to FIG. 34.

Figure 32:
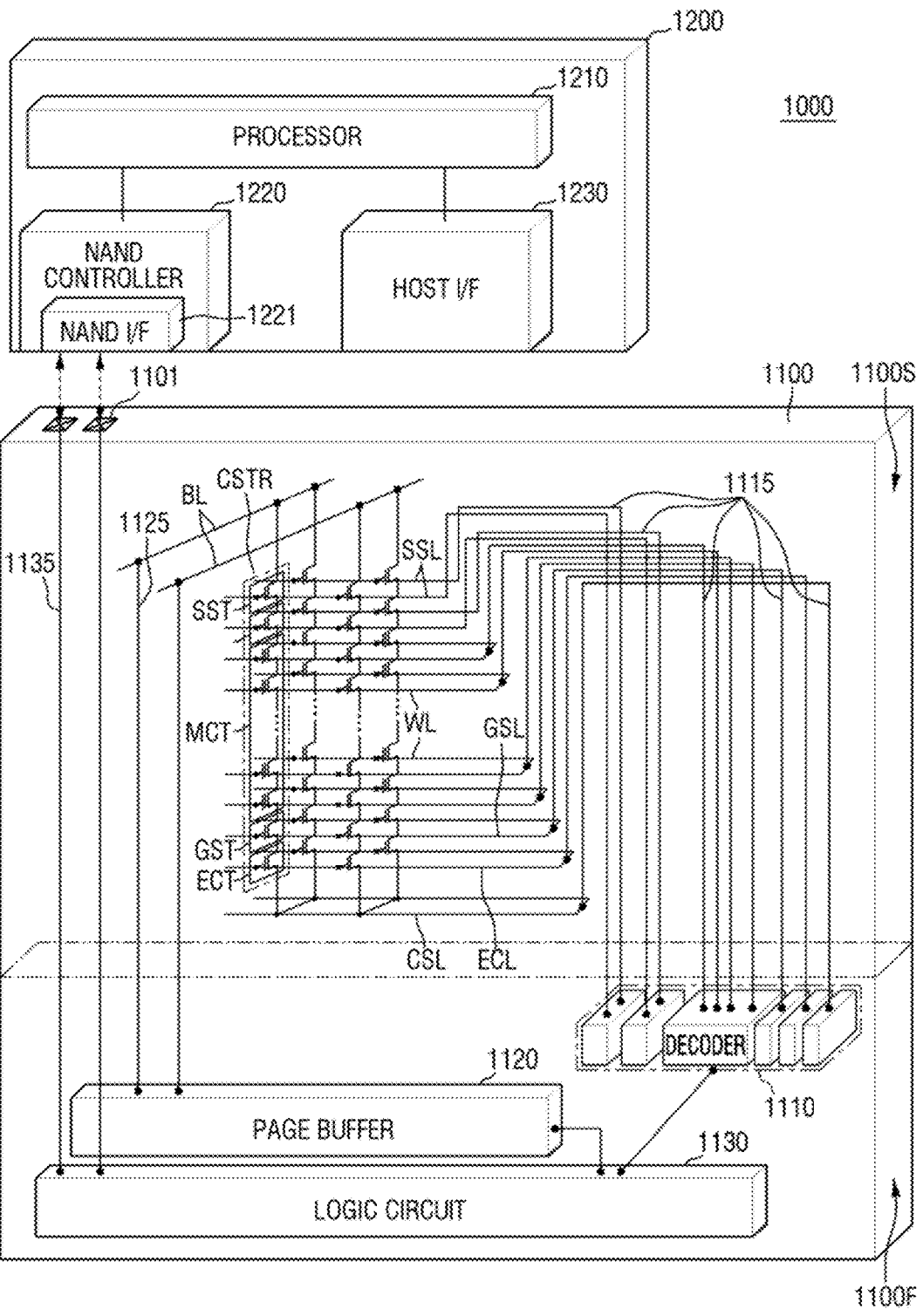
FIG. 32 is an illustrative block diagram of an electronic system according to example embodiments.
Figure 33:
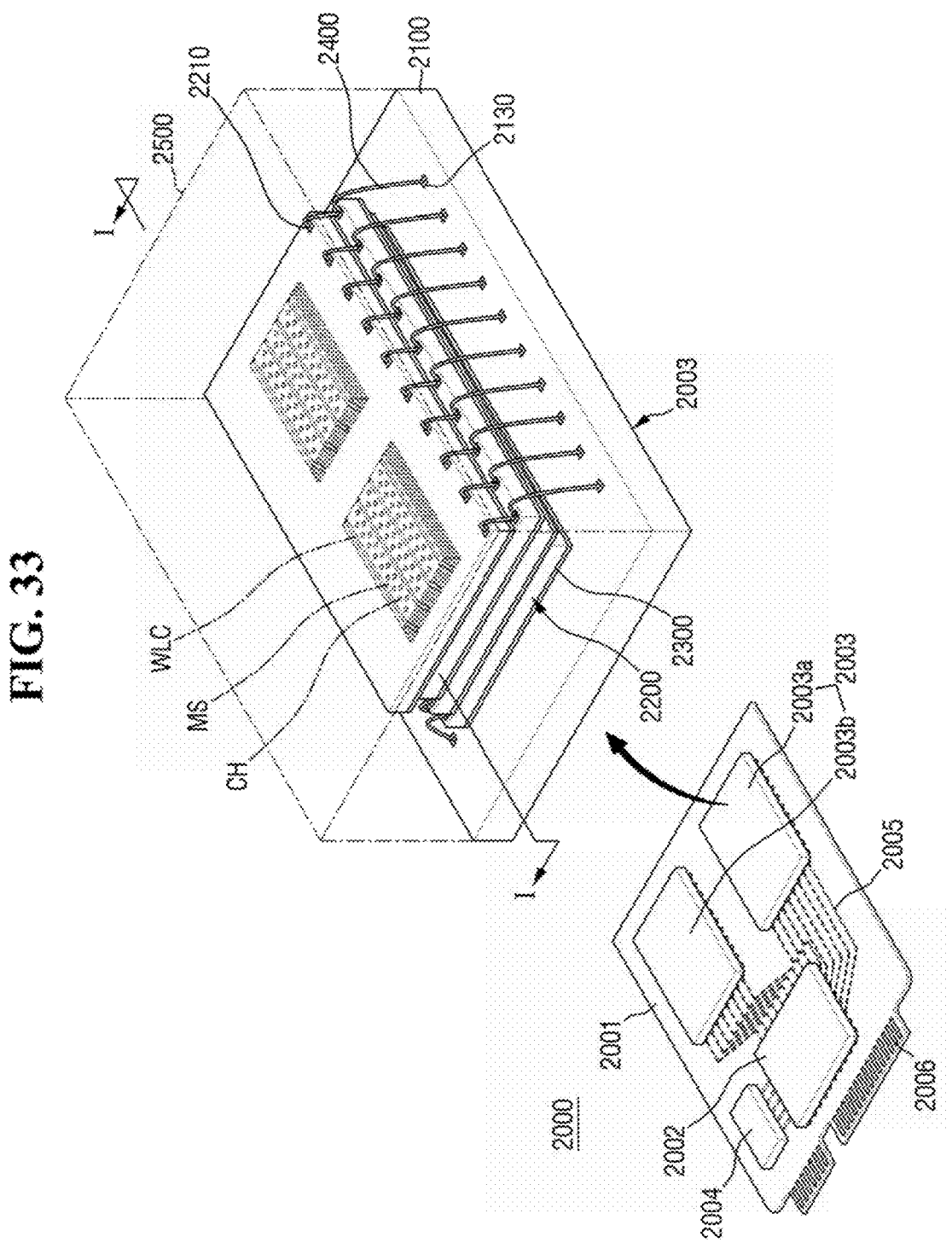
FIG. 33 is an illustrative perspective view of an electronic system according to example embodiments.
Figure 34:
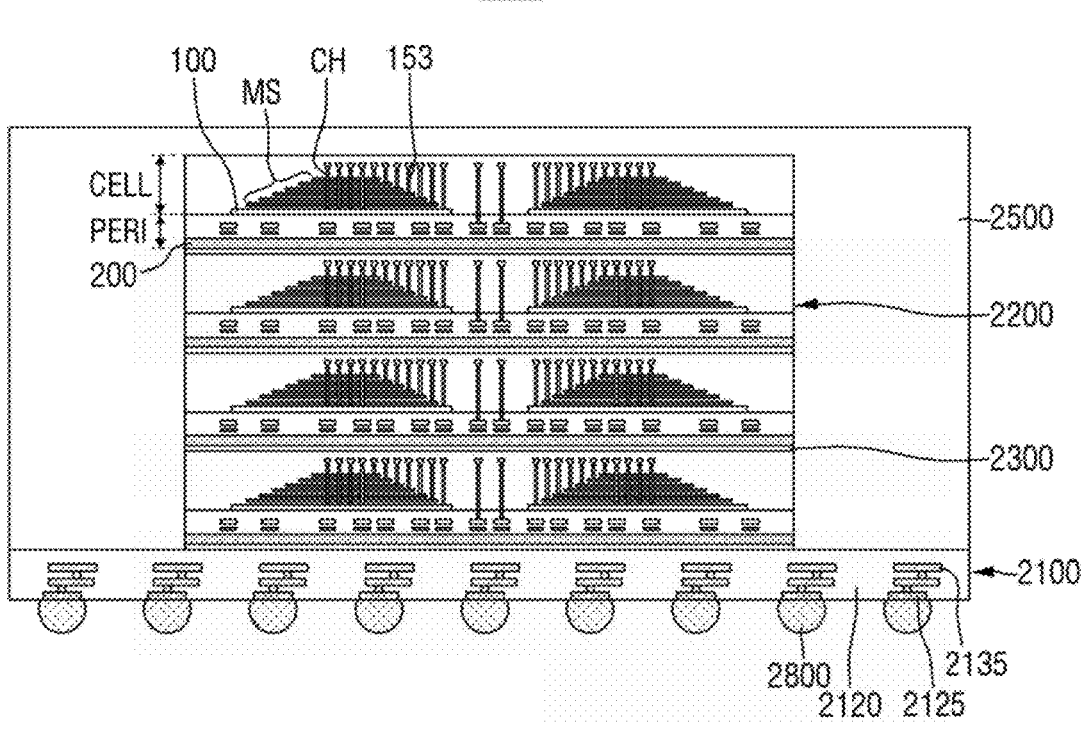
FIG. 34 is a schematic cross-sectional view taken along a line I-I of FIG. 33.

FIG. 32 is an illustrative block diagram of an electronic system according to example embodiments. FIG. 33 is an illustrative perspective view of an electronic system according to example embodiments. FIG. 34 is a schematic cross-sectional view taken along a line I-I of FIG. 33. Referring to FIG. 32, an electronic system 1000 according to some embodiments may include a semiconductor memory device 1100 and a controller 1200 electrically connected to the semiconductor memory device 1100. The electronic system 1000 may be a storage device including one or a plurality of semiconductor memory devices 1100 or an electronic device including the storage device. In an implementation, the electronic system 1000 may be embodied as a solid state drive device (SSD), a Universal Serial Bus (USB), a computing system, a medical device, or a communication device including one or a plurality of semiconductor memory devices 1100.

The semiconductor memory device 1100 may be embodied, e.g., as a NAND flash memory device and may include, e.g., the semiconductor memory device as described above with reference to FIGS. 1 to 6. The semiconductor memory device 1100 may include a first structure 1100F and a second structure 1100S on the first structure 1100F.

The first structure 1100F may be a peripheral circuit structure including a decoder circuit 1110 (e.g., the row decoder 33 in FIG. 1), the page buffer 1120 (e.g., the page buffer 35 in FIG. 1), and a logic circuit 1130 (e.g., the control logic 37 of FIG. 1).

The second structure 1100S may include the common source line CSL, the plurality of bit-lines BL, and the plurality of cell strings CSTR as described above with reference to FIG. 2. The cell strings CSTR may be connected to the decoder circuit 1110 via the word-line WL, at least one string select line SSL, and at least one ground select line GSL. Further, the cell strings CSTR may be connected to the page buffer 1120 via the bit-lines BL.

In some embodiments, the common source line CSL and the cell strings CSTR may be electrically connected to the decoder circuit 1110 via first connection lines 1115 extending from the first structure 1100F to the second structure 1100S.

In some embodiments, the bit-lines BL may be electrically connected to the page buffer 1120 via second connection lines 1125 extending from the first structure 1100F to the second structure 1100S.

The semiconductor memory device 1100 may communicate with the controller 1200 via an input/output pad 1101 electrically connected to the logic circuit 1130 (e.g., the control logic 37 in FIG. 1). The input/output pad 1101 may be electrically connected to the logic circuit 1130 via an input/output connection line 1135 extending from the first structure 1100F to the second structure 1100S.

The controller 1200 may include a processor 1210, a NAND controller 1220, and a host interface 1230. In some embodiments, the electronic system 1000 may include a plurality of semiconductor memory devices 1100. In this case, the controller 1200 may control the plurality of semiconductor memory devices 1100.

The processor 1210 may control overall operations of the electronic system 1000 including the controller 1200. The processor 1210 may operate based on predefined firmware, and may control the NAND controller 1220 to access the semiconductor memory device 1100. The NAND controller 1220 may include a NAND interface 1221 that processes communication with the semiconductor memory device 1100. Via the NAND interface 1221, a control command for controlling the semiconductor memory device 1100, data written to memory cell transistors MCT of the semiconductor memory device 1100, and data read from the memory cell transistors MCT of the semiconductor memory device 1100 may be transmitted. The host interface 1230 may provide a communication function between the electronic system 1000 and an external host. Upon receiving a control command from an external host via the host interface 1230, the processor 1210 may control the semiconductor memory device 1100 in response to the control command.

Referring to FIG. 32 to FIG. 34, an electronic system according to some embodiments may include a main substrate 2001, a main controller 2002 mounted on the main substrate 2001, at least one semiconductor package 2003, and at least one DRAM 2004. The semiconductor package 2003 and the DRAM 2004 may be connected to the main controller 2002 via wiring patterns 2005 on the main substrate 2001.

The main substrate 2001 may include a connector 2006 including a plurality of pins coupled to an external host. The number and an arrangement of the plurality of pins in the connector 2006 may vary based on a communication interface between the electronic system 2000 and the external host. In some embodiments, the electronic system 2000 may communicate with the external host using one of interfaces such as USB (Universal Serial Bus), PCI-Express (Peripheral Component Interconnect Express), SATA (Serial Advanced Technology Attachment), or M-Phy for UFS (Universal Flash Storage). In some embodiments, the electronic system 2000 may operate using power supplied from the external host via the connector 2006. The electronic system 2000 may further include a power management integrated circuit (PMIC) for distributing power supplied from the external host to the main controller 2002 and the semiconductor package 2003. The main controller 2002 may write data to the semiconductor package 2003 or read data from the semiconductor package 2003, and may improve an operating speed of the electronic system 2000.

The DRAM 2004 may act as a buffer memory for reducing a difference between operation speeds of the semiconductor package 2003 as a data storage space and the external host. The DRAM 2004 included in electronic system 2000 may operate as a cache memory, and may provide a space for temporarily storing data therein in a control operation of the semiconductor package 2003. When the DRAM 2004 is included in the electronic system 2000, the main controller 2002 may further include a DRAM controller for controlling the DRAM 2004 in addition to a NAND controller for controlling the semiconductor package 2003.

The semiconductor package 2003 may include a first semiconductor package 2003a and a second semiconductor package 2003b spaced apart from each other. Each of the first semiconductor package 2003a and the second semiconductor package 2003b may be embodied as a semiconductor package including a plurality of semiconductor chips 2200. Each of the first semiconductor package 2003a and the second semiconductor package 2003b may include a package substrate 2100, semiconductor chips 2200 on the package substrate 2100, adhesive layers 2300 on a bottom surface of each of the semiconductor chips 2200, a connection structure 2400 electrically connecting the semiconductor chips 2200 and the package substrate 2100 to each other, and a molding layer 2500 in the package substrate 2100 and covering the semiconductor chips 2200 and the connection structure 2400.

The package substrate 2100 may be embodied as a printed circuit board including package upper pads 2130. Each semiconductor chip 2200 may include an input/output pad 2210. The input/output pad 2210 may correspond to the input/output pad 1101 in FIG. 32.

In some embodiments, the connection structure 2400 may be embodied as a bonding wire that electrically connects the input/output pad 2210 and the package upper pads 2130 to each other. Accordingly, in each of the first semiconductor package 2003a and the second semiconductor package 2003b, the semiconductor chips 2200 may be electrically connected to each other in a bonding wire scheme, and may be electrically connected to the package upper pads 2130 of the package substrate 2100. In some embodiments, in each of the first semiconductor package 2003a and the second semiconductor package 2003b, the semiconductor chips 2200 may be electrically connected to each other via a connection structure including a through electrode (Through Silicon Via: TSV) instead of the connection structure 2400 using the bonding wire scheme.

In some embodiments, the main controller 2002 and the semiconductor chips 2200 may be included in one package. In some embodiments, the main controller 2002 and the semiconductor chips 2200 may be mounted on a separate interposer substrate different from the main substrate 2001, and the main controller 2002 and the semiconductor chips 2200 may be connected to each other via a wiring in the interposer substrate.

In some embodiments, the package substrate 2100 may be embodied as a printed circuit board. The package substrate 2100 may include a package substrate body 2120, the package upper pads 2130 on a upper surface of the package substrate body 2120, package lower pads 2125 on a bottom surface of the package substrate body 2120, or exposed through the bottom surface thereof, and internal lines 2135 in the package substrate body 2120 so as to electrically connect the upper pads 2130 and the lower pads 2125 to each other. The upper pads 2130 may be electrically connected to the connection structures 2400. The lower pads 2125 may be connected to the wiring patterns 2005 of the main substrate 2001 of the electronic system 2000 via conductive connectors 2800 as shown in FIG. 32.

Referring to FIG. 33 and FIG. 34, in the electronic system according to some embodiments, each of the semiconductor chips 2200 may include the semiconductor memory device as described above using FIG. 1 to FIG. 6. In an implementation, each of the semiconductor chips 2200 may include the peripheral circuit structure PERI and the cell structure CELL stacked on the peripheral circuit structure PERI. In one example, the peripheral circuit structure PERI may include the peripheral circuit substrate 200 and the peripheral circuit PT as described above using FIG. 3 to FIG. 6. Further, in one example, the cell structure CELL may include the cell substrate 100, the mold structure MS, the channel structure CH, the word-line cutting structure WLC, the plurality of first metal patterns 171, the plurality of second metal patterns 172, the first blocking pattern 141, the plurality of second blocking patterns 142, and the plurality of third blocking patterns 143.

By way of summation and review, the integration of the semiconductor memory devices may be an important factor in determining a price thereof. Thus, the semiconductor memory device having increased integration is disclosed.

Integration of a two-dimensional (2D) or planar semiconductor memory device may be largely determined based on an occupancy area of a unit memory cell, and therefore may be greatly affected by a level of a fine pattern formation skill. However, ultra-expensive equipment is required for formation of fine patterns. Thus, although the integration of the 2D semiconductor memory device is increasing, the increase is limited. Accordingly, a three-dimensional semiconductor memory device including three-dimensionally arranged memory cells may have been proposed. A semiconductor memory device with improved reliability and an electronic system including a semiconductor memory device with improved reliability is disclosed.

It will be understood that, although the terms "first", "second", "upper portion", "lower portion", etc. may be used herein to describe various elements or components, these elements or components should not be limited by these terms. These terms are only used to distinguish one element or component from another element or component. Therefore, a first element or component discussed below could be termed a second element or component without departing from the technical spirits of the present disclosure. Also, a lower element or an upper component could be termed an upper element or an upper component without departing from the technical spirits of the present disclosure.

Hereinafter, embodiments of the present disclosure will be described in detail with reference to the accompanying drawings. The same reference numerals are used for the same components in the drawings, and duplicate descriptions thereof are omitted.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A semiconductor memory device, comprising:
a substrate including a cell array area and an extension area;
a mold structure including:
a plurality of gate electrodes sequentially stacked on the cell array area of the substrate and stacked in a stair shape on the extension area of the substrate; and
a plurality of mold insulating films stacked alternately with the plurality of gate electrodes;
a plurality of channel structures on the cell array area of the substrate, wherein each of the plurality of channel structures extends through the mold structure and intersects the plurality of gate electrodes;
a plurality of cell contacts on the extension area of the substrate and respectively connected to the plurality of gate electrodes;
a first interlayer insulating film on the mold structure and covering the plurality of channel structures and the plurality of cell contacts;

a second interlayer insulating film on the first interlayer insulating film;
a plurality of first metal patterns respectively connected to the plurality of channel structures and in the first interlayer insulating film;
a plurality of second metal patterns respectively connected to the plurality of cell contacts, an upper surface of each of the plurality of second metal patterns being coplanar with an upper surface of each of the plurality of first metal patterns;
a first blocking pattern entirely covering the upper surfaces of the plurality of first metal patterns; and
a plurality of second blocking patterns entirely covering upper surfaces of the plurality of second metal patterns, respectively,
wherein at least a portion of the second interlayer insulating film is between adjacent ones of the plurality of second blocking patterns.

2. The semiconductor memory device as claimed in claim 1, wherein the first blocking pattern overlaps an entirety of a portion of the substrate in the cell array area in a thickness direction of the substrate.

3. The semiconductor memory device as claimed in claim 1, wherein a width of an upper surface of each of the plurality of second blocking patterns is greater than a width of the upper surface of each of the plurality of second metal patterns.

4. The semiconductor memory device as claimed in claim 1, wherein a width of an upper surface of each of the plurality of second blocking patterns is equal to a width of the upper surface of each of the plurality of second metal patterns.

5. The semiconductor memory device as claimed in claim 1, wherein the first blocking pattern includes a plurality of sub-blocking patterns respectively corresponding to the plurality of first metal patterns.

6. The semiconductor memory device as claimed in claim 5, wherein a width of an upper surface of each of the plurality of sub-blocking patterns is greater than a width of the upper surface of each of the plurality of first metal patterns.

7. The semiconductor memory device as claimed in claim 5, wherein at least a portion of the second interlayer insulating film is between adjacent ones of the plurality of sub-blocking patterns.

8. The semiconductor memory device as claimed in claim 1, further comprising:
a plurality of third metal patterns in the second interlayer insulating film;
a plurality of vias respectively on bottom surfaces of the plurality of third metal patterns;
a plurality of third blocking patterns entirely covering upper surfaces of the plurality of third metal patterns, respectively; and
a third interlayer insulating film on the second interlayer insulating film,
wherein at least a portion of the third interlayer insulating film is between adjacent ones of the plurality of third blocking patterns.

9. The semiconductor memory device as claimed in claim 8, wherein the plurality of vias are respectively connected to the plurality of first metal patterns and the plurality of second metal patterns.

10. The semiconductor memory device as claimed in claim 8, wherein a width of an upper surface of each of the plurality of third blocking patterns is greater than a width of an upper surface of each of the plurality of third metal patterns.

11. The semiconductor memory device as claimed in claim 8, wherein a width of an upper surface of each of the plurality of third blocking patterns is equal to a width of an upper surface of each of the plurality of third metal patterns.

12. A semiconductor memory device, comprising:
a substrate including a cell array area, an extension area, and a pad area;
a mold structure including:
a plurality of gate electrodes sequentially stacked on the cell array area of the substrate and stacked in a stair shape on the extension area of the substrate; and
a plurality of mold insulating films stacked alternately with the plurality of gate electrodes;
a plurality of channel structures on the cell array area of the substrate, wherein each of the plurality of channel structures extends through the mold structure and intersects the plurality of gate electrodes;
a plurality of cell contacts on the extension area of the substrate and respectively connected to the plurality of gate electrodes;
a plurality of first metal patterns respectively connected to the plurality of channel structures;
a first interlayer insulating film on the mold structure and covering the plurality of channel structures and the plurality of cell contacts;
a plurality of second metal patterns respectively connected to the plurality of cell contacts, an upper surface of each of the plurality of second metal patterns being coplanar with an upper surface of each of the plurality of first metal patterns; and
a first blocking layer extending along the upper surfaces of the plurality of first metal patterns and the upper surfaces of the plurality of second metal patterns, the first blocking layer having a plurality of first trenches defined therein exposing at least a portion of the first interlayer insulating film, the first blocking layer overlapping an entirety of each of the upper surfaces of the plurality of first metal patterns, and an entirety of each of the upper surfaces of the plurality of second metal patterns in a thickness direction of the substrate.

13. The semiconductor memory device as claimed in claim 12, wherein the plurality of first trenches are on the extension area and the pad area of the substrate, and are absent on the cell array area of the substrate.

14. The semiconductor memory device as claimed in claim 12, wherein the plurality of first trenches non-overlap the plurality of first metal patterns and the plurality of second metal patterns in the thickness direction of the substrate.

15. The semiconductor memory device as claimed in claim 12, further comprising a second interlayer insulating film on the first interlayer insulating film,
wherein the second interlayer insulating film includes a first portion on the first blocking layer, and a second portion in the plurality of first trenches.

16. The semiconductor memory device as claimed in claim 12, wherein a shape in a plan view of each of the plurality of first trenches includes a circle, a rectangle, or an ellipse.

17. The semiconductor memory device as claimed in claim 12, further comprising:
a second interlayer insulating film on the first interlayer insulating film;

a third interlayer insulating film on the second interlayer insulating film;
a plurality of third metal patterns in the second interlayer insulating film;
a plurality of vias respectively on bottom surfaces of the plurality of third metal patterns; and
a second blocking layer extending along upper surfaces of the plurality of third metal patterns and having a plurality of second trenches defined therein exposing at least a portion of the second interlayer insulating film,
wherein the third interlayer insulating film includes a first portion on the second blocking layer, and a second portion in the plurality of second trenches.

18. The semiconductor memory device as claimed in claim 17, wherein some of the plurality of first trenches overlap some of the plurality of second trenches.

19. The semiconductor memory device as claimed in claim 17, wherein some of the plurality of first trenches overlap each of the plurality of third metal patterns.

20. A semiconductor memory device, comprising:
a peripheral circuit structure including a peripheral circuit element; and
a cell structure on the peripheral circuit structure,
wherein the cell structure includes:
a substrate including a cell array area, an extension area, and a pad area;
a mold structure, the mold structure including:
a plurality of gate electrodes sequentially stacked on the cell array area of the substrate and stacked in a stair shape on the extension area of the substrate; and
a plurality of mold insulating films stacked alternately with the plurality of gate electrodes;
a first interlayer insulating film covering the mold structure;
a plurality of channel structures on the cell array area of the substrate, each of the plurality of channel structures extending through the first interlayer insulating film and the mold structure and intersecting the plurality of gate electrodes;
a plurality of cell contacts on the extension area of the substrate, the plurality of cell contacts extending through the first interlayer insulating film and being respectively connected to the plurality of gate electrodes;
a through-contact on the pad area of the substrate, the through-contact extending through the first interlayer insulating film and being connected to the peripheral circuit element;
a plurality of first metal patterns respectively connected to the plurality of channel structures;
a plurality of second metal patterns respectively connected to the plurality of cell contacts;
a third metal pattern connected to the through-contact;
a first blocking layer extending along upper surfaces of the plurality of first metal patterns, upper surfaces of the plurality of second metal patterns, and an upper surface of the third metal pattern, the first blocking layer having a plurality of first trenches defined therein exposing at least a portion of the first interlayer insulating film;
a second interlayer insulating film on the first interlayer insulating film;
a plurality of fourth metal patterns in the second interlayer insulating film; and
a second blocking layer extending along upper surfaces of the plurality of fourth metal patterns and having a plurality of second trenches defined therein exposing at least a portion of the second interlayer insulating film, wherein the upper surfaces of the plurality of first metal patterns, the upper surfaces of the plurality of second metal patterns, and the upper surface of the third metal pattern are coplanar with each other, wherein the first blocking layer covers an entirety of each of the upper surfaces of the plurality of first metal patterns, an entirety of each of the upper surfaces of the plurality of second metal patterns, and an entirety of the upper surface of the third metal pattern, wherein the second blocking layer covers an entirety of each of the upper surfaces of the plurality of fourth metal patterns, wherein an oxide insulating material is in the plurality of first trenches and the plurality of second trenches, and wherein the plurality of first trenches are on the extension area of the substrate and the pad area, and are absent on the cell array area of the substrate.

* * * * *